(12) United States Patent
Kim et al.

(10) Patent No.: US 12,035,567 B2
(45) Date of Patent: **\*Jul. 9, 2024**

(54) DISPLAY DEVICE HAVING ANTI-REFLECTION LAYER

(71) Applicant: Samsung Display Co., Ltd., Yongin-si (KR)

(72) Inventors: Hyeong Jun Kim, Yongin-si (KR); Ji Ryun Park, Yongin-si (KR); Chi Wook An, Yongin-si (KR); Mi Ran Ji, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 17/676,035

(22) Filed: Feb. 18, 2022

(65) Prior Publication Data

US 2022/0173362 A1 Jun. 2, 2022

Related U.S. Application Data

(63) Continuation of application No. 16/814,833, filed on Mar. 10, 2020, now Pat. No. 11,258,049.

(30) Foreign Application Priority Data

Jul. 2, 2019 (KR) .................. 10-2019-0079643

(51) Int. Cl.
*G06F 3/044* (2006.01)
*H10K 50/858* (2023.01)
(Continued)

(52) U.S. Cl.
CPC ......... *H10K 50/858* (2023.02); *G06F 3/0443* (2019.05); *H10K 50/86* (2023.02);
(Continued)

(58) Field of Classification Search
CPC .. G06F 2203/04111; G06F 2203/04112; G06F 3/0412; G06F 3/0443;
(Continued)

(56) References Cited

U.S. PATENT DOCUMENTS 9,640,782 B2 5/2017 Choi et al.
2004/0160165 A1 8/2004 Yamauchi
(Continued)

FOREIGN PATENT DOCUMENTS

EP 3223122 A2 9/2017
JP 2013-191464 A 9/2013
(Continued)

*Primary Examiner* — Richard J Hong
(74) *Attorney, Agent, or Firm* — Lewis Roca Rothgerber Christie LLP

(57) ABSTRACT

A display device includes a substrate having a light emission area, a light emitting element layer including a light emitting element on the light emission area, and an sensing layer on the light emitting element layer and including a sensing electrode having a first opening overlapping the light emission area, a first refraction layer directly on the sensing electrode and having a second opening overlapping the light emission area, and a second refraction layer on the light emitting element layer and the first refraction layer, a first optical refractive index of the first refraction layer being less than a second optical refractive index of the second refraction layer.

19 Claims, 18 Drawing Sheets

(51) Int. Cl.
*H10K 50/86* (2023.01)
*H10K 59/122* (2023.01)
*H10K 59/38* (2023.01)
*H10K 59/40* (2023.01)
*H10K 102/00* (2023.01)

(52) U.S. Cl.
CPC ......... *H10K 50/865* (2023.02); *H10K 59/122* (2023.02); *H10K 59/38* (2023.02); *H10K 59/40* (2023.02); *H10K 2102/351* (2023.02)

(58) Field of Classification Search
CPC ............. G06F 3/0446; H01L 2251/558; H01L 27/323; H01L 27/3246; H01L 51/5271; H01L 51/5275; H01L 51/5281; H01L 51/5284; H10K 59/40; H10K 59/35; H10K 50/86; H10K 59/131
See application file for complete search history.

(56) References Cited

U.S. PATENT DOCUMENTS

| | | |
|---|---|---|
| 2005/0174524 A1 | 8/2005 | Yuh et al. |
| 2010/0182250 A1 | 7/2010 | Kang et al. |
| 2012/0091441 A1 | 4/2012 | Matsushima |
| 2014/0160377 A1 | 6/2014 | Yamagishi et al. |
| 2015/0008399 A1 | 1/2015 | Choi et al. |
| 2015/0090992 A1 | 4/2015 | Miyazawa et al. |
| 2015/0187857 A1* | 7/2015 | Negishi .................. H10K 59/35 257/40 |
| 2016/0079567 A1* | 3/2016 | Cho ........................ H10K 50/86 257/40 |
| 2016/0087245 A1 | 3/2016 | Park et al. |
| 2016/0103516 A1 | 4/2016 | An |
| 2016/0132155 A1 | 5/2016 | Lee et al. |
| 2017/0179211 A1 | 6/2017 | Kanaya |
| 2017/0179437 A1 | 6/2017 | Kim et al. |
| 2017/0278899 A1 | 9/2017 | Yang et al. |
| 2017/0278900 A1 | 9/2017 | Yang et al. |
| 2018/0097038 A1* | 4/2018 | Lee ...................... H01L 27/3216 |
| 2018/0138458 A1 | 5/2018 | Tokuda |
| 2019/0013495 A1 | 1/2019 | Kim et al. |
| 2019/0074339 A1* | 3/2019 | Ma ........................ H10K 59/40 |
| 2019/0165061 A1 | 5/2019 | Jung et al. |
| 2020/0035769 A1 | 1/2020 | Youn et al. |
| 2020/0058729 A1* | 2/2020 | Jung ................... H10K 59/131 |
| 2020/0185652 A1 | 6/2020 | Sun |
| 2020/0249782 A1* | 8/2020 | Nakayama ............ G06F 3/0446 |
| 2020/0357856 A1 | 11/2020 | Koo et al. |
| 2020/0363905 A1* | 11/2020 | Jo ........................ H01L 27/322 |
| 2023/0329058 A1* | 10/2023 | Jung ................... H10K 59/131 257/40 |

FOREIGN PATENT DOCUMENTS

| | | |
|---|---|---|
| JP | 2015-176132 A | 10/2015 |
| KR | 10-2015-0145834 A | 12/2015 |

\* cited by examiner

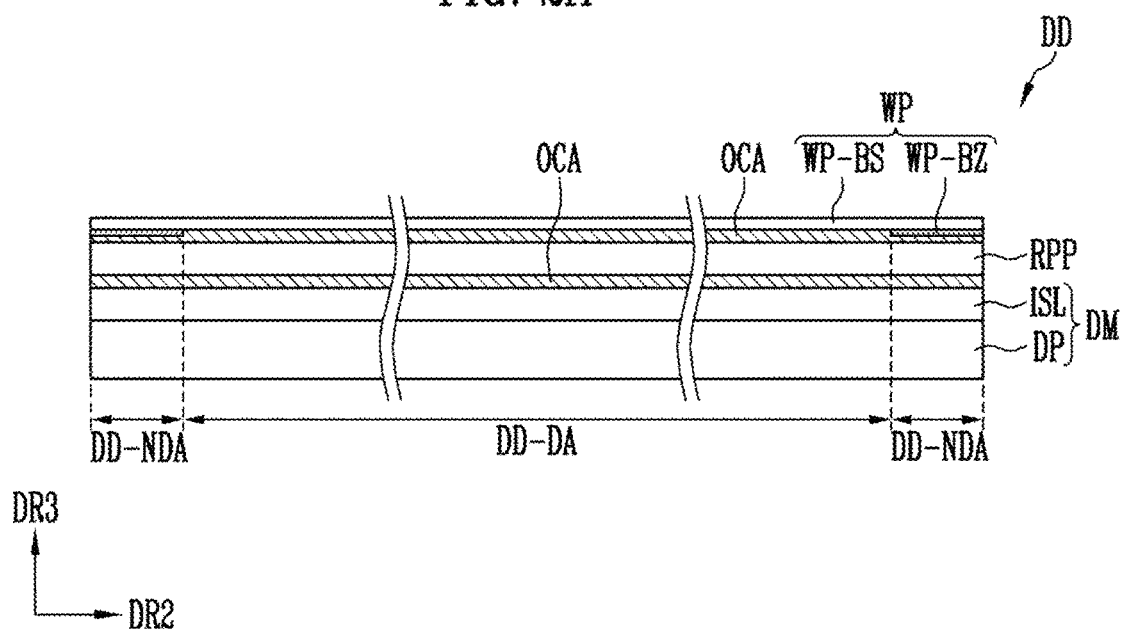
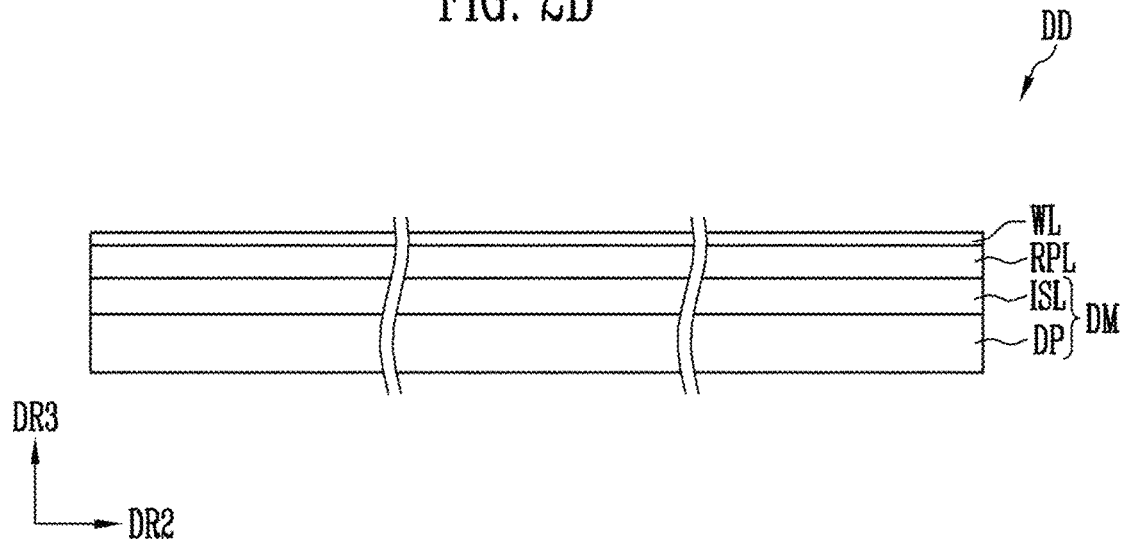

IMAGE1

IMAGE2

DISPLAY DEVICE HAVING ANTI-REFLECTION LAYER

CROSS-REFERENCE TO RELATED APPLICATIONS

This application is a continuation of U.S. patent application Ser. No. 16/814,833, filed Mar. 10, 2020, which claims priority to and the benefit of Korean Patent Application No. 10-2019-0079643, filed Jul. 2, 2019, the entire content of both of which is incorporated herein by reference.

BACKGROUND

1. Field

Aspects of the disclosure relate to a display device.

2. Description of the Related Art

A display device may include a display panel that displays an image, a window disposed on the display panel, and a functional panel interposed between the display panel and the window to receive a touch input or prevent reflection of external light.

The display panel may include a light emitting element, and light emitted from the light emitting element may be transmitted through the functional panel and the window and emitted in a front surface direction of the display device.

The above information disclosed in this Background section is only for enhancement of understanding of the background of the invention and therefore it may contain information that does not form the prior art.

SUMMARY

Various layers (e.g., insulating layers) configuring the functional panel and windows may have refractive indices (i.e., light refractive indices) different from each other. Therefore, some of the light emitted from the light emitting element may be refracted while passing through the layers, and may be extinguished without being emitted to the front surface of the display device.

Aspects of some embodiments of the disclosure are directed to a display device having improved light output efficiency.

Aspects of some embodiments the disclosure are directed to a display device having a simplified manufacturing process.

According to some embodiments, there is provided a display device including: a substrate having a light emission area; a light emitting element layer including a light emitting element on the light emission area; and an sensing layer on the light emitting element layer and including: a sensing electrode having a first opening overlapping the light emission area; a first refraction layer directly on the sensing electrode and having a second opening overlapping the light emission area; and a second refraction layer on the light emitting element layer and the first refraction layer, a first optical refractive index of the first refraction layer being less than a second optical refraction index of the second refraction layer.

In some embodiments, the light emitting element layer further includes a pixel defining layer having a third opening defining the light emission area, and wherein the light emitting element is positioned in the third opening.

In some embodiments, the light emitting element includes a first electrode, a light emitting layer, and a second electrode that are sequentially stacked.

In some embodiments, the second opening is greater in size than the third opening and is less in size than the first opening.

In some embodiments, a second optical refractive index of the second refractive layer is greater than the first optical refractive index of the first refractive layer by 0.2 to 0.4.

In some embodiments, each of the first refraction layer and the second refraction layer includes at least one of an acryl resin, an epoxy resin, a phenolic resin, a polyamide resin, and a polyimide resin.

In some embodiments, the first refraction layer has a first side surface inclined with respect to an upper surface of the light emitting element layer at the second opening, a first inclination angle of the first side surface is within a range of 60 to 85 degrees, and the first inclination angle increases as a difference between the first optical refractive index of the first refraction layer and the second optical refraction index of the second refraction layer increases.

In some embodiments, the first refractive layer has a thickness of 1 μm to 3 μm, and the thickness is reduced as the first inclination angle increases.

In some embodiments, the second opening has a planar shape different from a planar shape of the first opening.

In some embodiments, the first opening has a planar shape of a rhombus, and the second opening has a planar shape of a circle.

In some embodiments, a size of the second opening is based on a color of light emitted from the light emitting element.

In some embodiments, the substrate includes pixel areas, and each of the pixel areas includes the light emission area.

In some embodiments, the display device further includes: an anti-reflection layer on the sensing layer and including: a light transmission layer including a color filter overlapping the light emission area; a third refraction layer on the light transmission layer and including a fourth opening overlapping the light emission area; and a fourth refraction layer on the light transmission layer and the third refraction layer, and wherein a third optical refractive index of the third refractive layer is less than a fourth optical refractive index of the fourth refractive layer.

In some embodiments, the light transmission layer further includes a black matrix not overlapping the light emission area, the color filter covers the black matrix, and the third refraction layer is directly on the color filter.

In some embodiments, a difference between the fourth optical refractive index of the fourth refractive layer and the third optical refractive index of the third refractive layer is less than or equal to a difference between a second optical refractive index of the second refractive layer and the first optical refractive index of the first refractive layer.

In some embodiments, the first refraction layer has a first side surface inclined with respect to an upper surface of the light emitting element layer at the second opening, the third refraction layer has a second side surface inclined with respect to the upper surface of the light emitting element layer at the fourth opening, and a second inclination angle of the second side surface is greater than or equal to a first inclination angle of the first side surface.

In some embodiments, a total thickness of the first refraction layer and the third refraction layer is within a range of 1 μm to 3 μm.

According to some embodiments, there is provided a display device including: a substrate having a light emission area; a light emitting element layer including a light emitting element on the light emission area; and an anti-reflection layer on the light emitting element layer and including: a light transmission layer including a color filter overlapping the light emission area; a first refraction layer on the light transmission layer and having an opening overlapping the light emission area; and a second refraction layer on the light transmission layer and the first refraction layer, and wherein a first optical refractive index of the first refractive layer is less than a second optical refractive index of the second refractive layer.

In some embodiments, the light transmission layer further includes a black matrix not overlapping the light emission area, the color filter covers the black matrix, and the first refraction layer is directly on the color filter.

In some embodiments, the second optical refractive index of the second refractive layer is greater than the first optical refractive index of the first refractive layer by 0.2 to 0.4.

In some embodiments, each of the first refraction layer and the second refraction layer includes at least one of an acryl resin, an epoxy resin, a phenolic resin, a polyamide resin, and a polyimide resin.

In some embodiments, the first refraction layer has a first side surface inclined with respect to an upper surface of the light emitting element layer at the opening, a first inclination angle of the first side surface is within a range of 60 to 85 degrees, and the first inclination angle increases as a difference between the first optical refractive index of the first refraction layer and the second optical refraction index of the second refraction layer increases.

In some embodiments, the first refractive layer has a thickness of 1 μm to 3 μm, and the thickness is reduced as the first inclination angle increases.

The display device according to some embodiments of the disclosure includes a low refractive index flat layer and a high refractive index flat layer that are sequentially stacked on the sensing electrode of the sensing layer and/or the color filter, thereby improving light output efficiency of the light emitting element.

In addition, since the low refractive index flat layer is directly formed on the sensing electrode of the sensing layer and/or the color filter, a manufacturing process of the display device may be simplified.

BRIEF DESCRIPTION OF THE DRAWINGS

The above and other features of the disclosure will become more apparent by describing in further detail exemplary embodiments thereof with reference to the accompanying drawings, in which:

FIGS. 2A-2D are cross-sectional views illustrating an example of the display device of FIG. 1.

DETAILED DESCRIPTION

Figure 1:
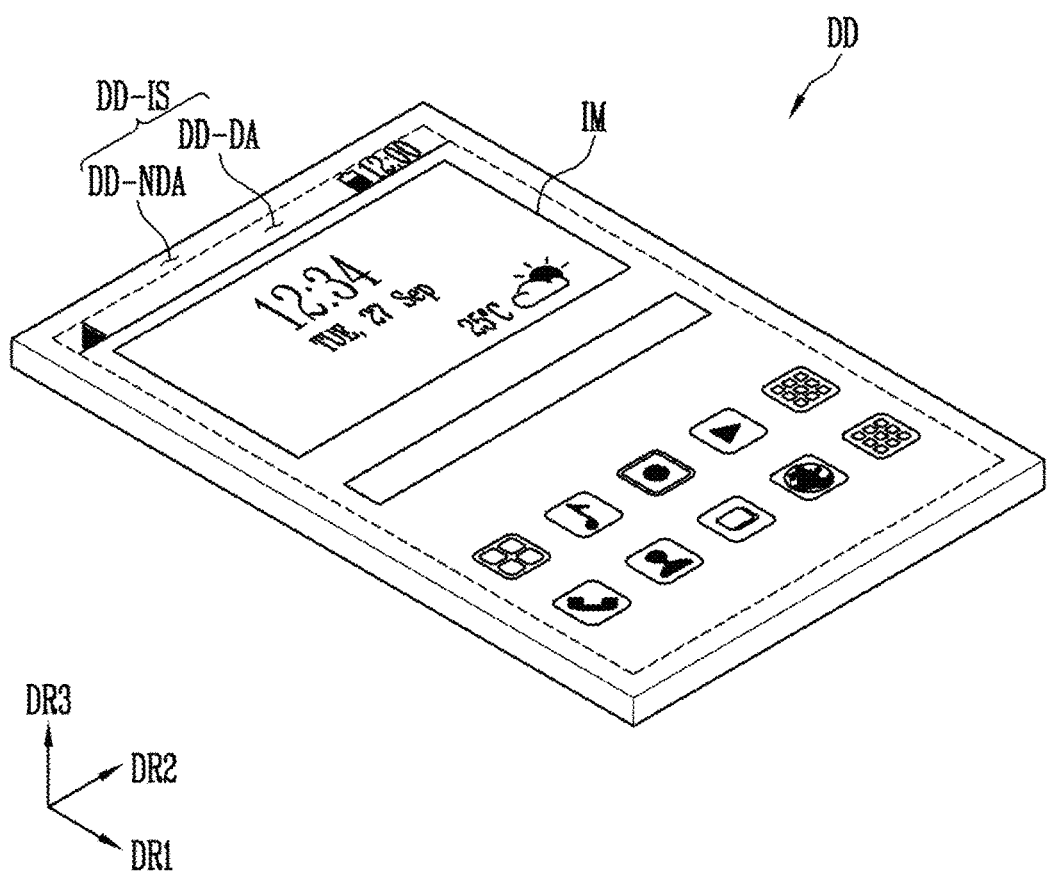
FIG. 1 is a perspective view illustrating a display device according to some example embodiments of the disclosure.

The disclosure may be modified in various suitable ways and may have various suitable forms, and specific embodiments will be illustrated in the drawings and described in detail herein. However, the disclosure is not limited to the embodiments disclosed below, and may be modified and practiced in various suitable forms.

In the drawings, some components which are not directly related to a characteristic of the disclosure may be omitted to clearly represent the disclosure. In addition, some components in the drawings may be shown to be exaggerated in size or proportion. Throughout the drawings, the same or similar components will be given the same reference numerals and symbols as much as possible even though they are shown in different drawings, and repetitive descriptions will be omitted.

FIG. 1 is a perspective view illustrating a display device according to embodiments of the disclosure.

Referring to FIG. 1, the display device DD may display an image IM through a display surface DD-IS. The display surface DD-IS may be parallel to a plane defined by a first direction axis corresponding to a first direction DR1 and a second direction axis corresponding to a second direction DR2. A direction normal to the display surface DD-IS, that is, a thickness direction of the display device DD, is defined as a third direction DR3.

A front surface (or an upper surface) and a back surface (or a lower surface) of each of members, layers, or units described below may be distinguished along the third direction DR3. However, the first to third directions DR1, DR2, and DR3 are merely examples, and the first to third directions DR1, DR2, and DR3 may be interchanged as relative concepts.

The display device DD may have a flat display surface. However, the disclosure is not limited thereto, and the display device DD according to an embodiment of the disclosure may have a display surface of various suitable types capable of displaying an image, such as a curved display surface or a stereoscopic display surface. When the display device DD according to an embodiment of the disclosure has a stereoscopic display surface, the stereoscopic display surface may include a plurality of display areas facing different directions as an example. The stereoscopic display surface may be implemented as a polygonal columnar display surface.

The display device DD may be a flexible display device. For example, the display device DD may be applied to a foldable display device, a bendable display device, a rollable display device, and the like. The disclosure is not limited thereto, and the display device DD may be a rigid display device.

FIG. 1 shows a display device DD that may be applied to a mobile phone terminal as an example. However, the display device DD is not limited thereto. For example, the display device DD may be applied to a large-sized electronic device such as a television, a monitor, or an electric signboard, a small-sized electronic device such as a tablet, a navigation device, a game device, or a smart watch, or the like. In addition, the display device DD may be applied to a wearable electronic device such as a head-mount display.

The display surface DD-IS of the display device DD may include a display area DD-DA where the image IM is displayed and a non-display area DD-NDA adjacent to the display area DD-DA. The non-display area DD-NDA is an area where an image is not displayed. The non-display area DD-NDA may be disposed outside the display area DD-DA.

FIGS. 2A to 2D are cross-sectional views illustrating an example of the display device of FIG. 1. FIGS. 2A to 2D schematically show the display device DD and illustrate a stack relationship of a functional panel and/or functional units configuring the display device DD.

Referring to FIGS. 2A to 2D, the display device DD may include a display panel DP, an input sensing layer ISL (or a sensing layer, an input sensing panel), and window units WP and WL. The display device DD may further include anti-reflection units RPP and RPL.

At least some configurations of the display panel DP, the input sensing layer ISL, and the window units WP and WL may be formed by a continuous process, or at least some configurations may be combined with each other through an adhesive member. The adhesive member may include a common adhesive or gluing agent. The adhesive member shown in FIG. 2A may be an optical transparent adhesive member OCA as an example.

In FIGS. 2A to 2D, a corresponding configuration formed through the continuous process with the other of the anti-reflection units RPP and RPL and the window units WP and WL is expressed as "layer". A configuration combined with the other of the anti-reflection units RPP and RPL and the window units WP and WL is expressed as a "panel". The panel may include a base layer providing a base surface, for example, a synthetic resin film, a composite film, a glass substrate, and the like, but the "layer" may not include a base layer. In other words, units expressed by the "layer" may be disposed on a base surface provided by the other unit.

The anti-reflection units RPP and RPL and the window units WL and WP may be referred to as an anti-reflection panel RPP, a window panel WP, anti-reflection layer RPL, and/or a window layer WL according to presence or absence of the base layer.

In an embodiment, as shown in FIG. 2A, the display device DD may include the display panel DP, the input sensing layer ISL, the anti-reflection panel RPP, and the window panel WP.

In an embodiment, the input sensing layer ISL may be disposed directly on the display panel DP. In the present specification, the phrase "a configuration of B is disposed directly on a configuration of A" means that a separate adhesive layer/adhesive member is not disposed between the configuration of A and the configuration of B. The configuration of B may be formed through a continuous process on a base surface provided by the configuration of A after the configuration of A is formed.

In an embodiment, the input sensing layer ISL may sense a touch or an input by an external medium, such as a hand or a pen, to the display surface DD-IS (e.g., refer to FIG. 1) of the display device DD.

A display module DM may be defined by including the display panel DP and the input sensing layer ISL disposed on the display panel DP. The optical transparent adhesive member OCA may be disposed between the display module DM and the anti-reflection panel RPP, and between the anti-reflection panel RPP and the window panel WP.

The input sensing layer ISL may be disposed in the display panel DP or on the display panel DP.

In an embodiment, the display panel DP may be a light emitting display panel. For example, the display panel DP may be an organic light emitting display panel or a quantum dot light emitting display panel.

The anti-reflection panel RPP reduces a reflectance of external light incident from an upper side of the window panel WP. In an embodiment, the anti-reflection panel RPP may include a phase retarder and a polarizer. The phase retarder may be a film type or a liquid crystal coating type, and may include a $\lambda/2$ (half-wavelength) phase retarder and/or a $\lambda/4$ (quarter-wavelength) phase retarder. The polarizer may also be a film type or a liquid crystal coating type.

In an embodiment, the anti-reflection panel RPP may include color filters. The color filters may have a set or predetermined arrangement. The arrangement of the color filters may be determined in consideration of light emission colors of pixels included in the display panel DP. The anti-reflection panel RPP may further include a black matrix adjacent to the color filters.

In an embodiment, the window panel WP may include a base film WP-BS and a light blocking pattern WP-BZ. The base film WP-BS may include a glass substrate, a synthetic resin film, and/or the like. The base film WP-BS is not limited to a single layer. The base film WP-BS may include two or more films combined with each other by an adhesive member.

The light blocking pattern WP-BZ may partially overlap the base film WP-BS. The light blocking pattern WP-BZ may be disposed on a back surface of the base film WP-BS to define a bezel area of the display device DD, that is, the non-display area DD-NDA (e.g., refer to FIG. 1).

The window panel WP may further include a functional coating layer disposed on an upper surface of the base film WP-BS. The functional coating layer may include a finger prevention layer, an anti-reflection layer, a hard coating layer, and the like.

As shown in FIG. 2B, the display device DD may include the display panel DP, the input sensing layer ISL, the anti-reflection layer RPL, and the window layer WL. An adhesive member may be omitted from the display device DD, and the input sensing layer ISL, the anti-reflection layer RPL, and the window layer WL may be formed in a continuous process on the base surface provided to the display panel DP. A stack order of the input sensing layer ISL and the anti-reflection layer RPL may be changed.

Figure 2C:
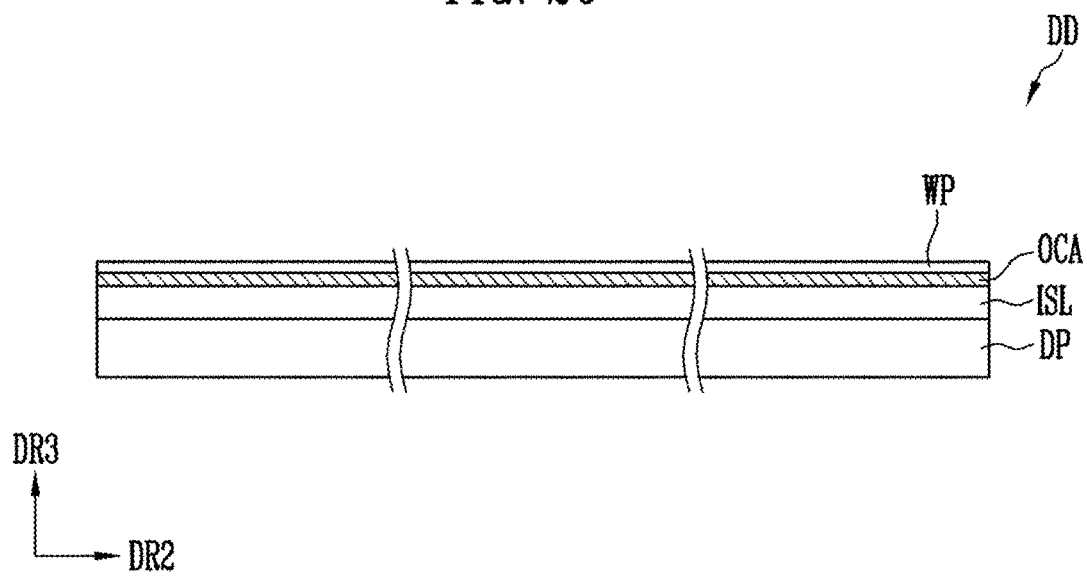

As shown in FIG. 2C, the display device DD may not include separate anti-reflection units RPP and RPL. In an embodiment, the display device DD may include the display panel DP, the input sensing layer ISL, and the window panel WP. Here, the input sensing layer ISL may further have an anti-reflection function.

Figure 2D:
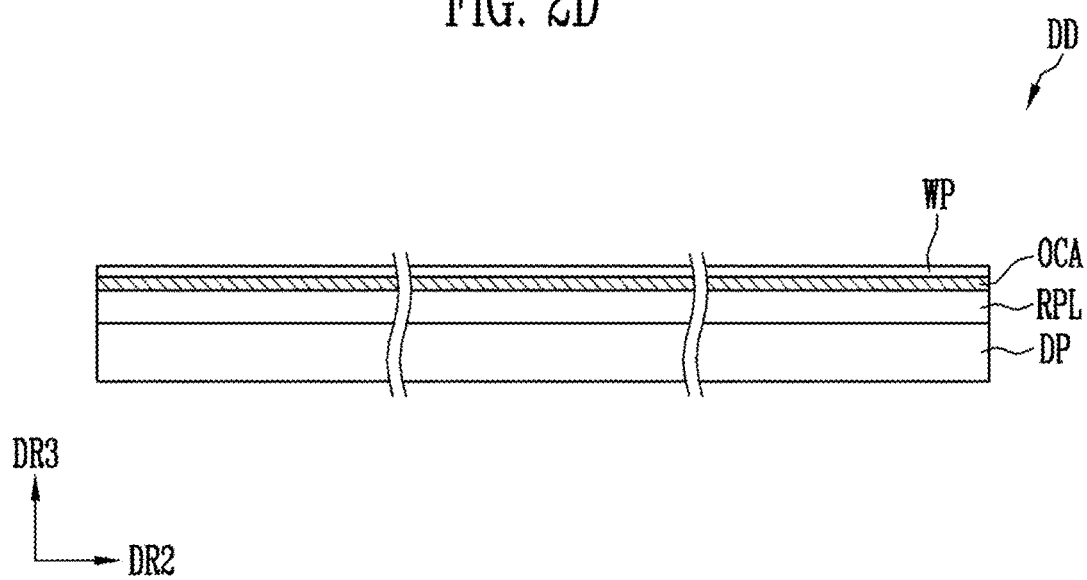

As shown in FIG. 2D, the display device DD may not include a separate input sensing layer ISL. In an embodiment, the display device DD may include the display panel DP, the anti-reflection layer RPL, and the window panel WP.

In FIGS. 2A to 2D, the input sensing unit is shown as being entirely overlapped the display panel DP. However, this is an example, and the input sensing layer ISL may overlap only a portion of the display area DD-DA, or may overlap only the non-display area DD-NDA. The input sensing layer ISL may be a touch sensing layer (or a touch sensing panel) that senses a touch of a user, or a fingerprint sensing layer (or a fingerprint sensing panel) that senses fingerprint information of a finger of the user. A pitch of the sensing electrodes and widths of sensing electrodes described below may be changed according to a use of the input sensing layer ISL.

Figure 3:
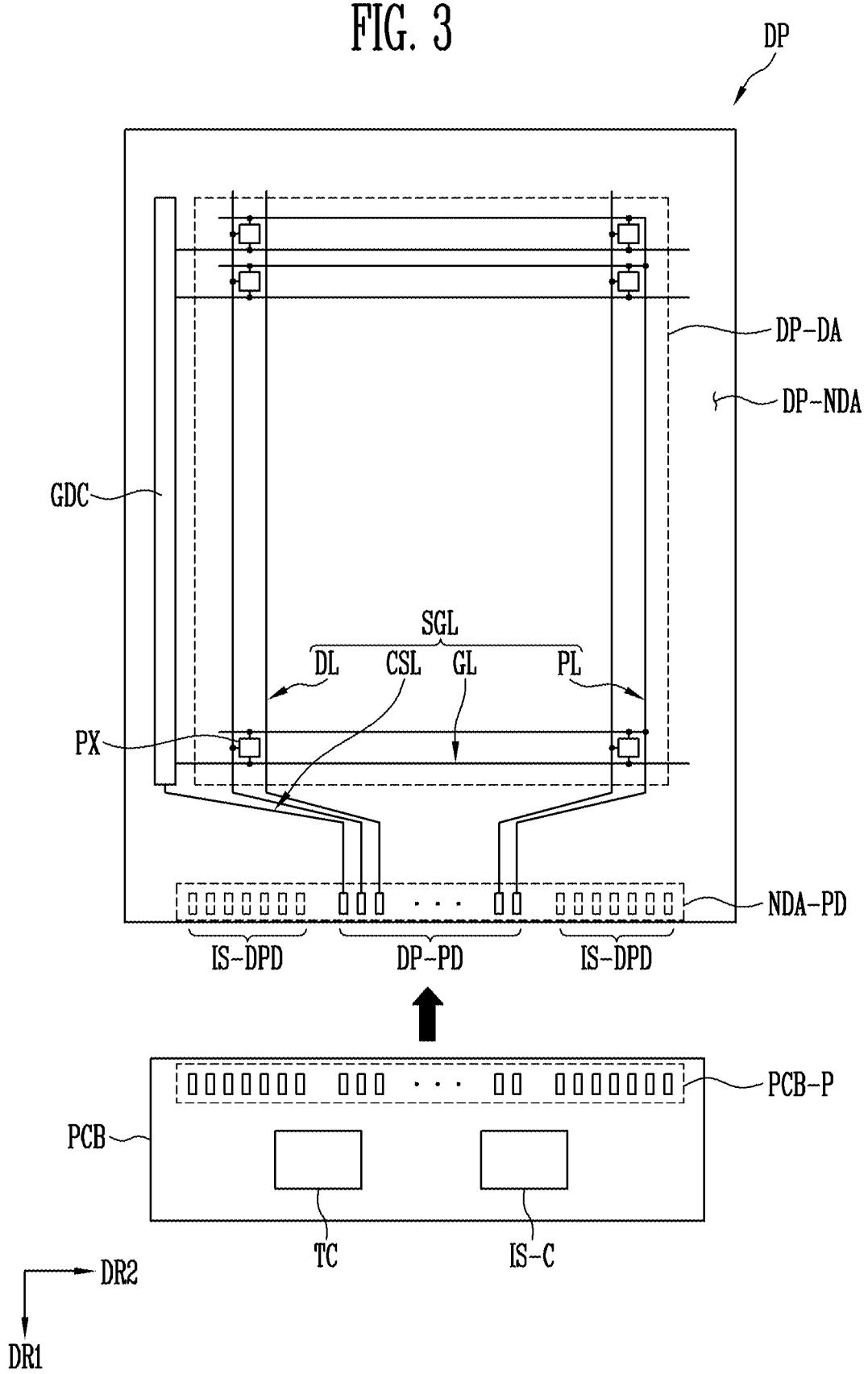
FIG. 3 is a cross-sectional view illustrating an example of a display panel included in the display device of FIG. 1.

FIG. 3 is a cross-sectional view illustrating an example of the display panel included in the display device of FIG. 1.

Referring to FIG. 3, the display area DP-DA may include pixel areas provided with pixels PX. The non-display area DP-NDA may be provided with a pad portion DP-PD provided with pads of wires. The non-display area DP-NDA may be provided with a data driver that provides a data signal to the pixels PX. The data driver may provide the data signal to each of the pixels PX through data lines.

The display panel DP may include a driving circuit GDC, signal lines SGL, signal pads DP-PD, and the pixels PX.

The pixels PX may be disposed in the display area DP-DA. Each of the pixels PX may include a light emitting element and a pixel driving circuit connected to the light emitting element. For example, the light emitting element may be an organic light emitting diode, but is not limited thereto. The driving circuit GDC, the signal lines SGL, the signal pads DP-PD, and the pixel driving circuit may be included in a pixel circuit layer PCL (e.g., refer to FIG. 7) described later.

The driving circuit GDC may include a scan driving circuit. The scan driving circuit may generate scan signals and sequentially provide or output the scan signals to scan lines GL. The scan driving circuit may further provide another control signal to the driving circuit of the pixels PX.

The scan driving circuit may include thin film transistors formed through the same process as the driving circuit of the pixels PX, for example, a low temperature polycrystalline silicon ("LTPS") process or a low temperature polycrystalline oxide ("LTPO") process.

The signal lines SGL may include the scan lines GL, data lines DL, a power line PL, and a control signal line CSL. Each of the scan lines GL may be connected to a corresponding pixel of the pixels PX and each of the data lines DL may be connected to a corresponding pixel of the pixels PX. The power line PL may be connected to the pixels PX. The control signal line CSL may provide control signals to the scan driving circuit.

The signal lines SGL may overlap the display area DP-DA and the non-display area DP-NDA. The signal lines SGL may include a pad portion and a line portion. The line portion may overlap the display area DP-DA and the non-display area DP-NDA. The pad portion may be connected to an end of the line portion. The pad portion may be disposed in the non-display area DP-NDA and may overlap a corresponding signal pad of the signal pads DP-PD. A detailed description thereof will be described later. An area where the signal pads DP-PD are disposed in the non-display area DP-NDA may be defined as a pad area NDA-PD.

The line portion connected to the pixels PX may form most of the signal lines SGL. The line portion may be connected to transistors T (e.g., refer to FIG. 7) of the pixels PX. The line portion may have a single layer/multilayer structure, and the line portion may be a single body or may include two or more portions. The two or more portions may be disposed on different layers and may be connected to each other through a contact hole passing through an insulating layer disposed between the two or more portions.

The display panel DP may further include dummy pads IS_DPD disposed in the pad area NDA-PD. Since the dummy pads IS_DPD are formed through the same process as the signal lines SGL, the dummy pads IS_DPD may be disposed on the same layer as the signal lines SGL. The dummy pads IS_DPD may be selectively provided in the display device DD including the input sensing layer ISL as shown in FIGS. 2A to 2C, and may be omitted in the display device DD including an input sensing unit.

In FIG. 3, a circuit board PCB electrically connected to the display panel DP is additionally shown. The circuit board PCB may be a flexible circuit board or a rigid circuit board. The circuit board PCB may be directly coupled to the display panel DP or connected to the display panel DP through another circuit board.

A timing control circuit TC that controls an operation of the display panel DP may be disposed on the circuit board PCB. In addition, an input sensing circuit IS_C that controls the input sensing layer ISL (or the input sensing unit) may be disposed on the circuit board PCB. Each of the timing control circuit TC and the input sensing circuit IS_C may be mounted on the circuit board PCB in a form of an integrated chip. As another example, the timing control circuit TC and the input sensing circuit IS_C may be mounted on the circuit board PCB in a form of a single integrated chip. The circuit board PCB may include circuit board pads PCB-P electrically connected to the display panel DP. The circuit board PCB may further include signal lines connecting the circuit board pads PCB-P with the timing control circuit TC and/or the input sensing circuit IS_C.

Figure 4:
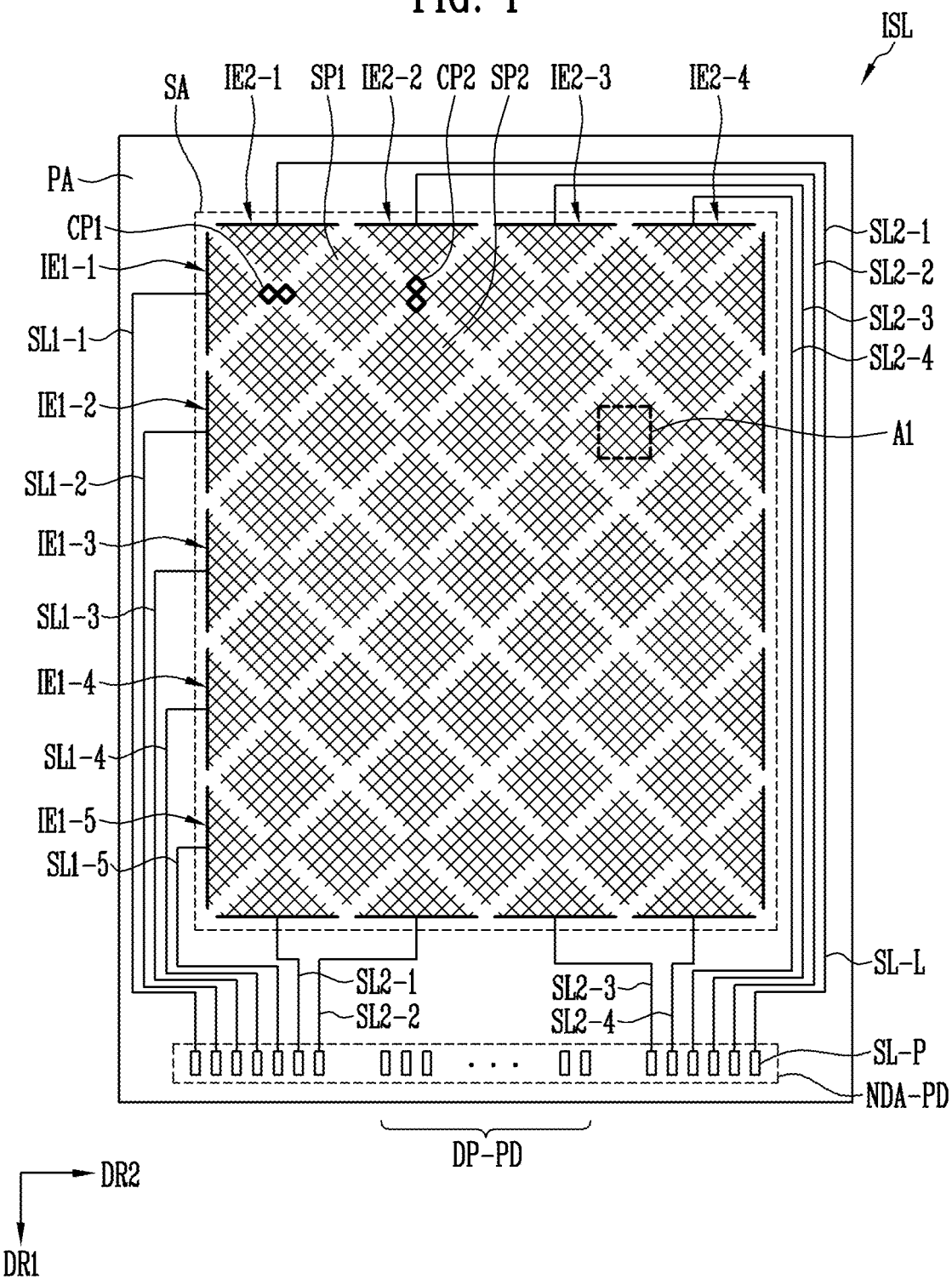
FIG. 4 is a plan view illustrating an example of an input sensing layer included in the display device of FIG. 1.
Figure 5:
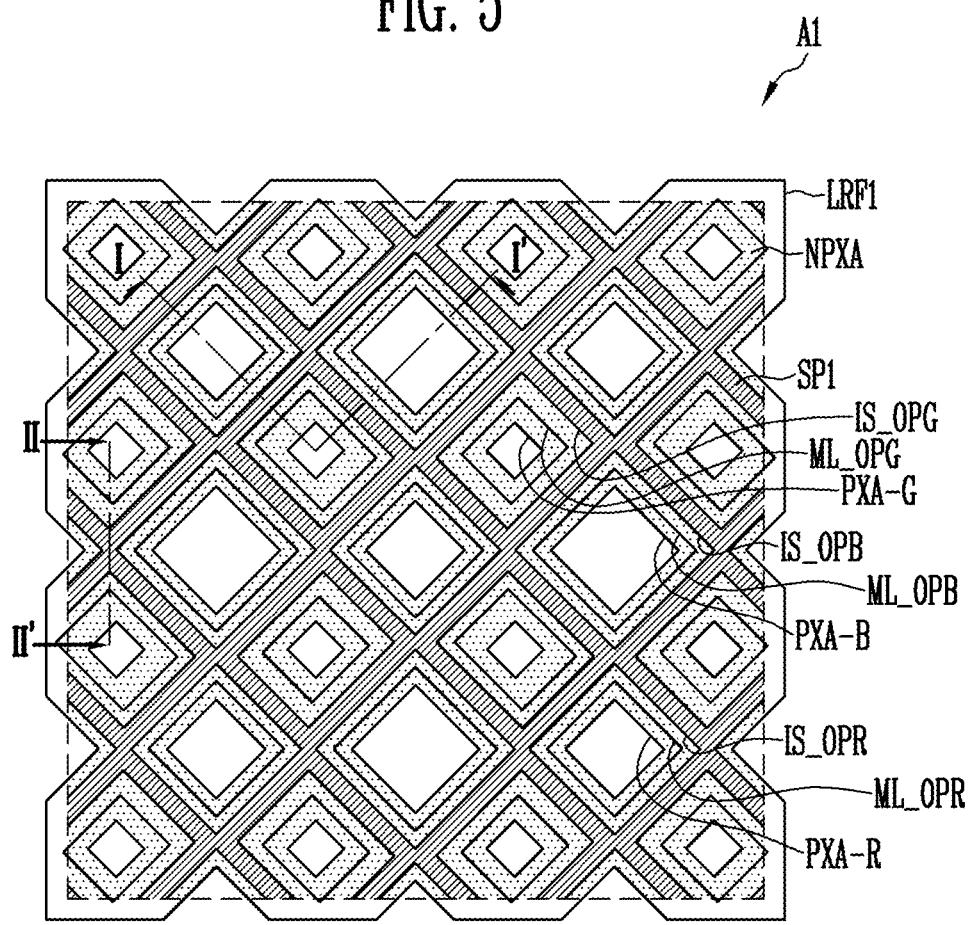
FIGS. 5-6 are enlarged plan views of a first area of the input sensing layer of FIG. 4.
Figure 6:
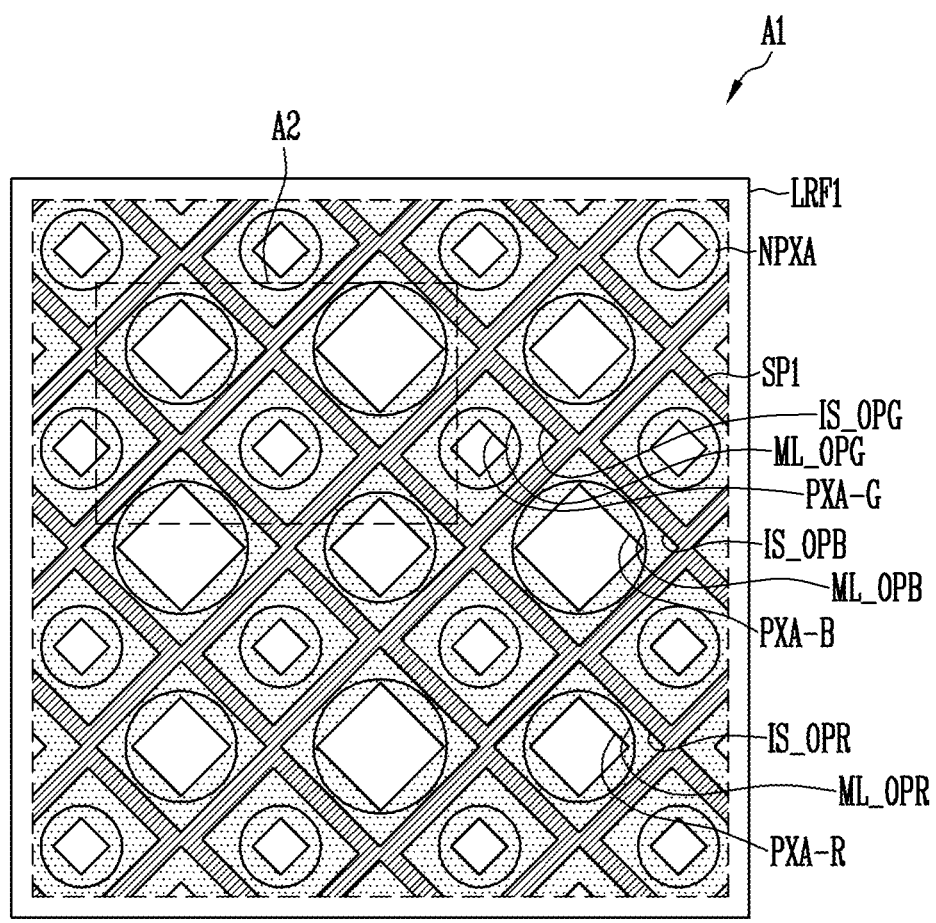

FIG. 4 is a plan view illustrating an example of the input sensing layer included in the display device of FIG. 1. FIGS. 5 and 6 are enlarged plan views of a first area of the input sensing layer of FIG. 4.

Referring to FIG. 4, the input sensing layer ISL may include a sensing area SA that senses an input of a user, for example, a touch and/or a pressure at the time of the touch, and a peripheral area PA provided on at least one side of the sensing area SA.

The sensing area SA may correspond to the display area DP-DA of the display panel DP and may have substantially the same area as the display area DP-DA or may have an area greater than the display area DP-DA. The peripheral area PA may be disposed adjacent to the sensing area SA. In addition, the peripheral area PA may correspond to the non-display area DP-NDA of the display panel DP.

The input sensing layer ISL may include first sensing electrodes IE1-1 to IE1-5 and second sensing electrodes IE2-1 to IE2-4 provided in the sensing area SA, the first signal lines SL1-1 to SL1-5 and the second signal lines SL2-1 to SL2-4 provided in the peripheral area PA.

First sensor portions SP1 may be arranged along the second direction DR2 in one first sensing electrode and second sensor portions SP2 may be arranged in the first direction DR1 in one second sensing electrode. Each of first connection portions CP1 may connect adjacent first sensor portions SP1 to each other and each of the second connection portions CP2 may connect adjacent second sensor portions SP2 to each other.

The first sensing electrodes IE1-1 to IE1-5 and the second sensing electrodes IE2-1 to IE2-4 may have a mesh pattern or a mesh structure. The mesh pattern may include mesh lines that are metal lines forming at least one mesh hole IS_OPR, IS_OPG, or IS_OPB (or mesh opening). The mesh holes IS_OPR, IS_OPG, and IS_OPB may have a plane shape of a rhombus by the mesh lines, but are not limited thereto.

The first sensing electrodes IE1-1 to IE1-5 and the second sensing electrodes IE2-1 to IE2-4 have the mesh pattern, and thus a parasitic capacitance with the electrodes of the display panel DP may be reduced.

In addition, as shown in FIG. 5, in the first area A1, the first sensing electrodes IE1-1 to IE1-5 and the second sensing electrodes IE2-1 to IE2-4 may not be overlapped light emission areas PXA-R, PXA-G, and PXA-B. Here, the light emission areas PXA-R, PXA-G, and PXA-B may be included in each of the pixels PX (or the pixel areas in which the pixels PX are provided). Therefore, the first sensing electrodes IE1-1 to IE1-5 and the second sensing electrodes IE2-1 to IE2-4 may not be visible to the user of the display device DD.

The first sensing electrodes IE1-1 to IE1-5 and the second sensing electrodes IE2-1 to IE2-4 may include aluminum, copper, chromium, nickel, titanium, and the like. However, the disclosure is not limited thereto, and the sensing electrodes may be formed of various suitable metals.

As an example, when the first sensing electrodes IE1-1 to IE1-5 and the second sensing electrodes IE2-1 to IE2-4 are formed of a metal of which a low temperature process is possible, even though the input sensing layer ISL is formed in a continuous process after a manufacturing process of the display panel DP, damage to the light emitting element OLED (e.g., refer to FIG. 7) may be prevented or substantially reduced.

When the first sensing electrodes IE1-1 to IE1-5 and the second sensing electrodes IE2-1 to IE2-4 are disposed directly on the display panel DP in the mesh pattern, flexibility of the display device DD may be improved (e.g., increased).

In FIG. 3, the first sensing electrodes IE1-1 to IE1-5 and the second sensing electrodes IE2-1 to IE2-4 include the first sensor portions SP1 and second sensor portions SP2 of a rhombus shape. However, the disclosure is not limited thereto, and the first sensor portions SP1 and the second sensor portions SP2 may have a polygon shape. The first sensing electrodes IE1-1 to IE1-5 and the second sensing electrodes IE2-1 to IE2-4 may have a shape (e.g., a bar shape) without distinction between the sensor portion and the connection portion.

The first signal lines SL1-1 to SL1-5 may be connected to one of the ends of the first sensing electrodes IE1-1 to IE1-5, respectively. The second signal lines SL2-1 to SL2-4 may be connected to both ends of the second sensing electrodes IE2-1 to IE2-4. However, the disclosure is not limited thereto. For example, the first signal lines SL1-1 to SL1-5 may be connected to both ends of the first sensing electrodes IE1-1 to IE1-5. As another example, the second signal lines SL2-1 to SL2-4 may be connected to only one end of the second sensing electrodes IE2-1 to IE2-4, respectively.

Since lengths of the second sensing electrodes IE2-1 to IE2-4 are longer than those of the first sensing electrodes IE1-1 to IE1-5, a voltage drop of a detection signal (or a transmission signal) in the second sensing electrodes IE2-1 to IE2-4 is greater than that in the first sensing electrodes IE1-1 to IE1-5, and thus a sensing sensitivity may be reduced. Since the detection signal (or the transmission signal) is transmitted through the second signal lines SL2-1 to SL2-4 connected to the both ends of the second sensing electrodes IE2-1 to IE2-4, the voltage drop of the detection signal (or the transmission signal) and the reduction of the sensing sensitivity may be prevented or substantially mitigated.

The first signal lines SL1-1 to SL1-5 and the second signal lines SL2-1 to SL2-4 may include a line portion SL-L and a pad portion SL-P. The pad portions SL-P may be aligned in the pad areas NDA-PD. The pad portion SL-P may overlap the dummy pads IS_DPD shown in FIG. 3.

The input sensing layer ISL may further include the signal pads DP-PD. The signal pads DP-PD may be aligned in the pad areas NDA-PD.

Referring to FIG. 5, the first sensor portions SP1 may not overlap the light emission areas PXA-R, PXA-G, and PXA-B and may overlap the non-light emission area NPXA.

The mesh lines (e.g., metal lines) of the first sensor portions SP1 may define the mesh holes IS_OPR, IS_OPG, and IS_OPB. The mesh holes IS_OPR, IS_OPG, and IS_OPB may correspond to the light emission areas PXA-R, PXA-G, and PXA-B one-to-one. The light emission areas PXA-R, PXA-G, and PXA-B may be exposed by the mesh holes IS_OPR, IS_OPG, and IS_OPB.

A line width of the mesh lines may be less than a width of a pixel defining layer corresponding to the non-light emission area NPXA (i.e., the pixel defining layer defining the light emission areas PXA-R, PXA-G, and PXA-B).

Therefore, light emitted from the light emission areas PXA-R, PXA-G, and PXA-B is minimally blocked by the mesh lines, and the mesh lines may be prevented or substantially prevented from being viewed to the user.

The mesh lines may have a three layer structure of titanium/aluminum/titanium.

Figure 7:
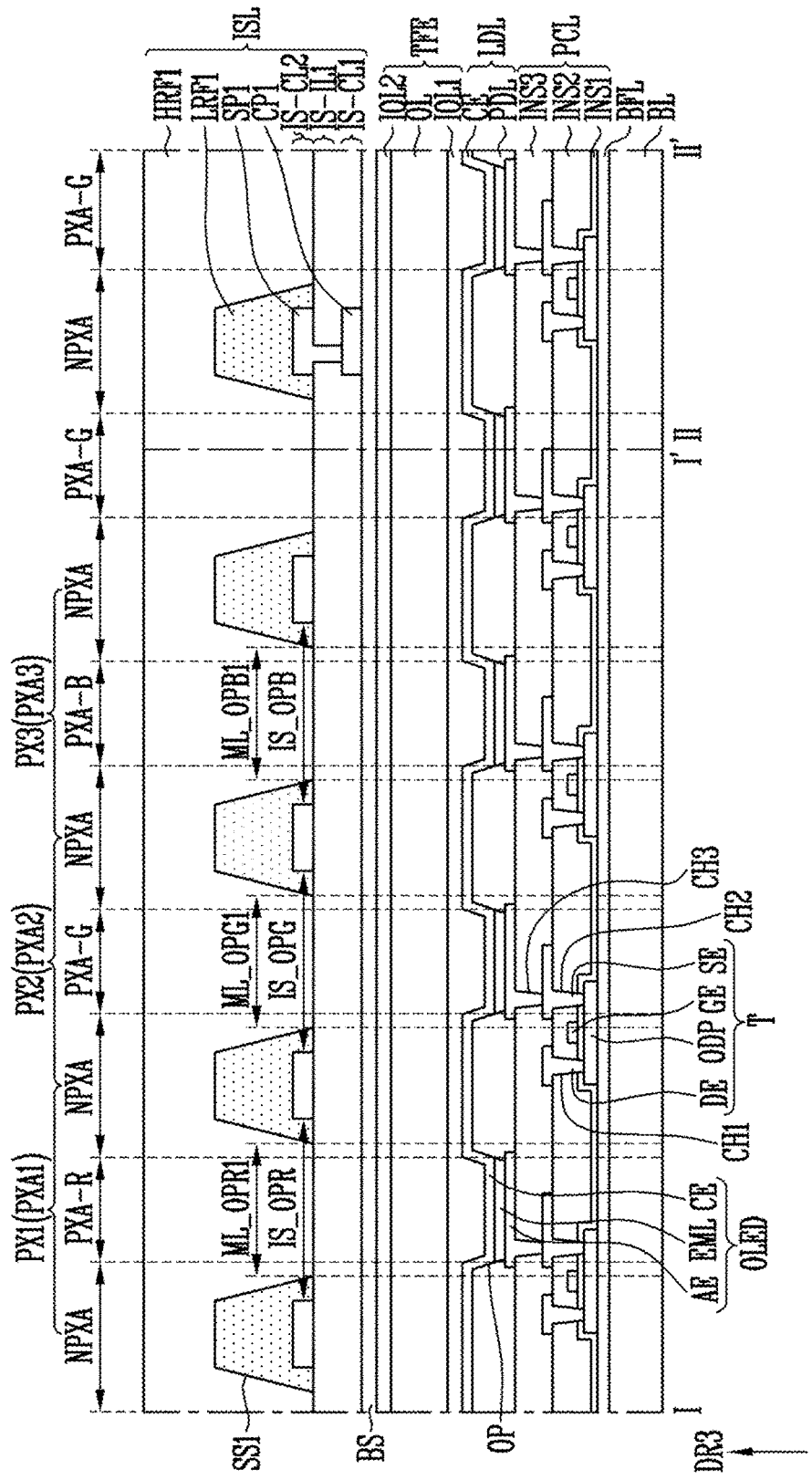
FIG. 7 is a cross-sectional view illustrating an example of the display device taken along the line I-I' and the line II-II' of FIG. 5.

The light emission areas PXA-R, PXA-G, and PXA-B may be divided into a plurality of groups according to a color of light generated in the light emitting element OLED (e.g., refer to FIG. 7). In FIG. 5, the light emission areas PXA-R, PXA-G, and PXA-B are divided into three groups according to a light emission color.

The light emission areas PXA-R, PXA-G, and PXA-B may have different areas according to the color emitted from the organic light emitting diode. The areas of the light emission areas PXA-R, PXA-G, and PXA-B may be determined according to a type of the organic light emitting diode.

The mesh holes IS_OPR, IS_OPG, and IS_OPB may be divided into a plurality of groups having different areas. The mesh holes IS_OPR, IS_OPG, and IS_OPB may be divided into three groups according to the corresponding light emission areas PXA-R, PXA-G and PXA-B.

In FIG. 5, the mesh holes IS_OPR, IS_OPG, and IS_OPB corresponds to the light emission areas PXA-R, PXA-G, and PXA-B one-to-one, but are not limited thereto. For example, each of the mesh holes IS_OPR, IS_OPG, and IS_OPB may correspond to two or more light emission areas PXA-R, PXA-G, and PXA-B.

In FIG. 5, the areas of the light emission areas PXA-R, PXA-G, and PXA-B are different, however, this is an example, and are not limited thereto. For example, sizes of the light emission areas PXA-R, PXA-G, and PXA-B may be the same, and sizes of the mesh holes IS_OPR, IS_OPG, and IS_OPB may also be the same. The planar shape of the mesh holes IS_OPR, IS_OPG, and IS_OPB is not limited, and may have a polygon shape different from the rhombus. The planar shape of the mesh holes IS_OPR, IS_OPG, and IS_OPB may have a polygon shape of which a corner portion is rounded.

In embodiments, the first sensor portions SP1 (or the first and second sensing electrodes IE1-1 to IE1-5 and IE2-1 to IE2-4, and the input sensing layer ISL) may further include a first low refractive index flat layer LRF1 (or a low refractive index organic layer, a first refractive layer, and a light path control structure).

The first low refractive index flat layer LRF1 may have a refractive index (or, a refractive index for light, an optical refractive index) relatively less than that of a first high refractive index flat layer HRF1 (e.g., refer to FIG. 7) to be described later. The first low refractive index flat layer LRF1 may not overlap the light emission areas PXA-R, PXA-G, and PXA-B, and may overlap the non-light emission area NPXA. In addition, the first low refractive index flat layer LRF1 may overlap the mesh lines or cover the mesh lines of the first sensor portions SP1.

Holes ML_OPR, ML_OPG, and ML_OPB (or openings) passing through the first low refractive index flat layer LRF1 may be formed in the first low refractive index flat layer LRF1. That is, the first low refractive index flat layer LRF1 may include the holes ML_OPR, ML_OPG, and ML_OPB. The holes ML_OPR, ML_OPG, and ML_OPB may correspond to the light emission areas PXA-R, PXA-G, and PXA-B (or the mesh holes IS_OPR, IS_OPG, and IS_OPB) one-to-one. The light emission areas PXA-R, PXA-G, and PXA-B (or the mesh holes IS_OPR, IS_OPG, and IS_OPB) may be exposed by the holes ML_OPR, ML_OPG, and ML_OPB.

The holes ML_OPR, ML_OPG, and ML_OPB of the first low refractive index flat layer LRF1 may have different areas according to the color emitted by the light emitting element OLED. However, the disclosure is not limited thereto, sizes of the holes ML_OPR, ML_OPG, and ML_OPB may be the same and sizes of the mesh holes IS_OPR, IS_OPG, and IS_OPB may also be the same.

In addition, the planar shape of the holes ML_OPR, ML_OPG, ML_OPB is not limited, and may have a polygon shape different from a rhombus. For example, as shown in FIG. 6, the holes ML_OPR, ML_OPG, and ML_OPB may have a circle shape on a plane. When the holes ML_OPR, ML_OPG, and ML_OPB have the circle shape, light may be uniformly emitted from the entire edges of the holes ML_OPR, ML_OPG, and ML_OPB.

FIG. 7 is a cross-sectional view illustrating an example of the display device taken along the line I-I' and the line II-II' of FIG. 5.

Referring to FIG. 7, the display device includes first to third pixels PX1, PX2, and PX3. The first to third pixels PX1, PX2, and PX3 are substantially the same or similar to each other. Therefore, the display device will be described with reference to the first pixel PX1 by covering the first to third pixels PX1, PX2, and PX3.

The display device may include a base layer BL (or a substrate), a buffer layer BFL, a pixel circuit layer PCL, a light emitting element layer LDL, and an input sensing layer ISL.

The base layer BL may include a synthetic resin film. The synthetic resin layer may be a polyimide-based resin layer, and a material thereof is not particularly limited. In addition, the base layer BL may include a glass substrate, a metal substrate, or an organic/inorganic composite substrate.

The buffer layer BFL may be provided on the base layer BL. The buffer layer BFL prevents an impurity from diffusing into a thin film transistor TFT provided on the base layer BL and may improve a flatness of the base layer BL. The buffer layer BFL may be provided as a single layer, but may be provided as multiple layers of at least two or more layers. The buffer layer BFL may be an inorganic insulating film formed of an inorganic material. For example, the buffer layer BFL may be formed of silicon nitride, silicon oxide, silicon oxynitride, and/or the like. When the buffer layer BFL is provided as the multiple layers, each layer may be formed of the same material or may be formed of different materials. The buffer layer BFL may be omitted in some cases.

The pixel circuit layer PCL may include at least one insulating layer and a circuit element. The insulating layer may include at least one inorganic film and at least one organic film. The circuit element may include a signal line, a pixel driving circuit, and the like.

A semiconductor pattern ODP of the transistor T may be disposed on the buffer layer BFL. The semiconductor pattern ODP may be selected from amorphous silicon, polysilicon, or metal oxide semiconductors.

A first insulating layer INS1 may be disposed on the semiconductor pattern ODP. The first insulating layer INS1 may be an inorganic insulating film formed of an inorganic material. For example, the first insulating layer INS1 may be formed of silicon nitride, silicon oxide, silicon oxynitride, and/or the like.

A control electrode GE of the transistor T may be disposed on the first insulating layer INS1. The control electrode GE may be manufactured according to the same photolithography process as the scan lines GL of FIG. 2.

A second insulation layer INS2 covering the control electrode GE may be disposed on the first insulation layer INS1. The second insulating layer INS2 may be an inorganic insulating film formed of an inorganic material. For example, the second insulating layer INS2 may be formed of silicon nitride, silicon oxide, silicon oxynitride, and/or the like.

A first transistor electrode DE (or a drain electrode) and a second transistor electrode SE (or a source electrode) of the transistor T may be disposed on the second insulating layer INS2.

The first transistor electrode DE and the second transistor electrode SE may be connected to the semiconductor pattern ODP through a first through hole CH1 and a second through hole CH2 through the first insulating layer INS1 and the second insulating layer INS2, respectively. On the other hand, in another embodiment of the disclosure, the transistor T may be modified to a bottom gate structure and may be implemented.

A third insulating layer INS3 covering the first transistor electrode DE and the second transistor electrode SE may be disposed on the second insulating layer INS2. The third insulating layer INS3 may provide a flat surface. The third insulating layer INS3 may be formed of an organic film such as an acryl resin, an epoxy resin, a phenolic resin, a polyamide resin, or a polyimide resin.

The light emitting element layer LDL is disposed on the third insulating layer INS3. The light emitting element layer LDL may include the pixel defining layer PDL and the light emitting element OLED.

The pixel defining layer PDL may include an organic material. A first electrode AE may be disposed on the third insulating layer INS3. The first electrode AE may be connected to the second transistor electrode SE through a third through hole CH3 passing through the third insulating layer INS3. The pixel defining layer PDL may include an opening portion OP and the opening portion OP may define the light emission areas PXA-R, PXA-G, and PXA-B.

The opening portion OP of the pixel defining layer PDL may expose at least a portion of the first electrode AE.

The display area DP-DA (e.g., refer to FIG. 3) described with reference to FIG. 3 may include the light emission areas PXA-R, PXA-G, and PXA-B and the non-light emission area NPXA between the light emission areas PXA-R, PXA-G, and PXA-B. The non-light emission area NPXA may surround the light emission areas PXA-R, PXA-G, and PXA-B. Each of the light emission areas PXA-R, PXA-G, and PXA-B may correspond to a portion of the first electrode AE exposed by the opening portion OP. The non-light emission area NPXA may be defined to correspond to the pixel defining layer PDL.

The light emitting element OLED may include the first electrode AE connected to the second transistor electrode SE, a light emitting layer EML disposed on the first electrode AE, and a second electrode CE disposed on the light emitting layer EML. For example, the light emitting element OLED may be an organic light emitting diode.

One of the first electrode AE and the second electrode CE may be an anode electrode and the other may be a cathode electrode. For example, the first electrode AE may be the anode electrode, and the second electrode CE may be the cathode electrode.

In an embodiment, the first electrode may be a reflective electrode and the second electrode may be a transmissive electrode.

In each pixel area, the first electrode AE may be disposed on the third insulating layer INS3. The first electrode AE may include a reflective film capable of reflecting light, and a transparent conductive film disposed on or under the reflective film. At least one of the transparent conductive film and the reflective film may be connected to the second transistor electrode SE.

The reflective film may include a material capable of reflecting light. For example, the reflective film may include at least one of aluminum (Al), silver (Ag), chromium (Cr), molybdenum (Mo), platinum (Pt), nickel (Ni), and an alloy thereof.

The transparent conductive film may include a transparent conductive oxide. For example, the transparent conductive film may include transparent conductive oxide of at least one of indium tin oxide ("ITO"), indium zinc oxide ("IZO"), aluminum zinc oxide ("AZO"), gallium doped zinc oxide ("GZO"), zinc tin oxide ("ZTO"), gallium tin oxide ("GTO"), and fluorine doped tin oxide ("FTO").

The light emitting layer EML may be disposed on an exposed surface of the first electrode AE. The light emitting layer EML may have a multilayer thin film structure including a light generation layer ("LGL"). For example, the light emitting layer EML may include a hole injection layer ("HIL") for injecting holes, a hole transport layer ("HTL") having excellent transportability of the holes and for increasing an opportunity of recombination of the holes and electrons by suppressing movement of the electrons that are not combined in the light generation layer, the light generation layer for emitting light by the recombination of the injected electrons and holes, a hole blocking layer ("HBL") for suppressing movement of the holes that are not combined in the light generation layer, an electron transport layer ("ETL") for smoothly transporting the electrons to the light generation layer, and an electron injection layer ("EIL") for injecting the electrons.

A color of the light generated in the light generation layer may be one of red, green, blue, and white, but the present embodiment is not limited thereto. For example, the color of the light generated in the light generation layer of the light emitting layer EML may be one of magenta, cyan, and yellow.

The hole injection layer, the hole transport layer, the hole blocking layer, the electron transport layer, and the electron injection layer may be a common film connected with each other in adjacent pixel areas.

The second electrode CE may be disposed on the light emitting layer EML. The second electrode CE may be a transflective film. For example, the second electrode CE may be a thin type metal layer having a thickness enough to transmit light. The second electrode CD may transmit some of the light generated in the light generation layer and reflect the remains of the light generated in the light generation layer.

The second electrode CE may include a material having a work function lower than that of the transparent conductive film. For example, the second electrode CE may include at least one of molybdenum (Mo), tungsten (W), silver (Ag), magnesium (Mg), aluminum (Al), platinum (Pt), palladium (Pd), nickel (Ni), neodymium (Nd), iridium (Ir), chromium (Cr), lithium (Li), calcium (Ca), and an alloy thereof.

Some of the light emitted from the light emitting layer EML may not transmit the second electrode CE, and the light reflected from the second electrode CE may be reflected again from the reflective film. That is, the light emitted from the light emitting layer EML may resonate between the reflective film and the second electrode CE. Light extraction efficiency of the light emitting element LD may be improved by the resonance of the light.

A distance between the reflective film and the second electrode CE may be changed according to the color of the light generated in the light generation layer. That is, according to the color of the light generated in the light generation layer, the distance between the reflective film and the second electrode CE may be adjusted to match a resonance distance.

A thin film encapsulation layer TFE may be disposed on the second electrode CE. The thin film encapsulation layer TFE may be commonly disposed in the first to third pixels PX1, PX2, and PX3. The thin film encapsulation layer TFE may directly cover the second electrode CE. In an embodiment, a capping layer covering the second electrode CE may be further disposed between the thin film encapsulation layer TFE and the second electrode CE. At this time, the thin film encapsulation layer TFE may directly cover the capping layer.

The thin film encapsulation layer TFE may include a first encapsulation inorganic film IOL1, an encapsulation organic film OL, and a second encapsulation inorganic film IOL2 that are sequentially stacked on the second electrode CE. The encapsulation inorganic film may be formed of an inorganic insulating material such as polysiloxane, silicon nitride, silicon oxide, or silicon oxynitride. The encapsulation organic film may be formed of an organic insulating material such as a polyacryl-based compound, a polyimide-based compound, a fluorocarbon-based compound such as Teflon, or a benzocyclobutene compound.

The input sensing layer ISL may be provided on the thin film encapsulation layer TFE. The input sensing layer ISL may include a second buffer layer BFL2, a first conductive layer IS_CL1, a fourth insulating layer IS_IL1, a second conductive layer IS_CL2, the first low refractive index flat layer LRF1, and the first high refractive index flat layer HRF1.

A second buffer layer BFL2 may be provided on the thin film encapsulation layer TFE. The second buffer layer BFL2 may be provided as a single layer, but may be provided as multiple layers of at least two or more layers. The second buffer layer BFL2 may be an inorganic insulating film formed of an inorganic material. For example, the second buffer layer BFL2 may be formed of silicon nitride, silicon oxide, silicon oxynitride, and/or the like. The second buffer layer BFL2 may be omitted in some cases.

The first conductive layer IS_CL1 may be disposed on the second buffer layer BFL2 (or the thin film encapsulation layer TFE) and may include the first connection portions CP1 described with reference to FIG. 4.

The first conductive layer IS_CL1 may have a single layer structure or may have a multi-layer structure stacked along the third direction DR3.

The conductive layer of the single layer structure may include a metal layer or a transparent conductive layer. The metal layer may include molybdenum, silver, titanium, copper, aluminum, and an alloy thereof. The transparent conductive layer may include a transparent conductive oxide such as indium tin oxide ("ITO"), indium zinc oxide ("IZO"), zinc oxide ("ZnO"), or indium tin zinc oxide ("ITZO"). In addition, the transparent conductive layer may include conductive polymers such as PEDOT, a metal nanowire, a graphene, and/or the like.

The conductive layer of the multi-layer structure may include metal layers of multiple layers. The metal layers of the multiple layers may have a three layer structure, for example, titanium/aluminum/titanium. The conductive layer of the multi-layer structure may include at least one metal layer and at least one transparent conductive layer.

The fourth insulating layer IS_IL1 may be disposed on the first conductive layer IS_CL1 and the second buffer layer BFL2 (or the thin film encapsulation layer TFE). The fourth insulating layer IS_IL1 may have a single layer or multi-layer structure. The fourth insulating layer IS_IL1 may include an inorganic material, an organic material, or a composite material.

In an embodiment, the fourth insulating layer IS_IL1 may include an inorganic film. The inorganic film may include at least one of aluminum oxide, titanium oxide, silicon oxide, silicon oxynitride, zirconium oxide, and hafnium oxide. For example, the fourth insulating layer IS_IL1 may include silicon nitride and may be formed to a thickness of about 3000 Å.

The second conductive layer IS_CL2 may be disposed on the fourth insulating layer IS_IL1. The second conductive layer IS_CL2 may include the first sensor portions SP1, the second sensor portions SP2 (e.g., refer to FIG. 4), and the second connection portions CP2 (e.g., refer to FIG. 4).

A structure (e.g., a single layer structure, a stack structure) and a material of the second conductive layer IS_CL2 are substantially the same as or similar to the structure and the material of the first conductive layer IS_SL1, respectively, and thus the repetitive description is omitted.

The second conductive layer IS_CL2 may be in contact with the first conductive layer IS_CL1 through a contact hole exposing the first conductive layer IS_CL1 by passing through the fourth insulating layer IS_IL1.

As described with reference to FIG. 4, the second conductive layer IS_CL2 may include the mesh holes IS_OPR, IS_OPG, and IS_OPB.

The mesh holes IS_OPR, IS_OPG, and IS_OPB may correspond to the light emission areas PXA-R, PXA-G, and PXA-B one-to-one. The light emission areas PXA-R, PXA-G, and PXA-B may be exposed by the mesh holes IS_OPR, IS_OPG, and IS_OPB.

The first low refractive index flat layer LRF1 may be disposed on the second conductive layer IS_CL2 and may cover the second conductive layer IS_CL2.

As described with reference to FIG. 4, the first low refractive index flat layer LRF1 may include the holes ML_OPR1, ML_OPG1, and ML_OPB1, and the holes ML_OPR1, ML_OPG1, and ML_OPB1 may correspond to the light emission areas PXA-R, PXA-G, PXA-B (or the mesh holes IS_OPR, IS_OPG, and IS_OPB one-to-one.

In an embodiment, the holes ML_OPR1, ML_OPG1, and ML_OPB1 may be greater in size than the light emission areas PXA-R, PXA-G, and PXA-B, respectively, and may be less than the mesh holes IS_OPR, IS_OPG, and IS_OPB.

For example, a size (a width or an area on a plane) of the first hole ML_OPR1 may be greater than a size of the first emission area PXA-R of the first pixel PX1 and may be less than a size of the first mesh hole IS_OPR. In this case, the first light emission area PXA-R may be exposed by the first hole ML_OPR1 and the second conductive layer IS_CL2 (or the first sensor portions SP1) may be covered by the low refractive index flat layer LRF1.

Similarly, a size (or a width, an area on a plane) of the second hole ML_OPG may be greater than a size of the second emission area PXA-G of the second pixel PX2 and may be less than a size of the second mesh hole IS_OPG. A size (or a width, an area on a plane) of the third hole ML_OPB may be greater than a size of the third emission area PXA-B of the third pixel PX3 and may be less than a size of the third mesh hole IS_OPB.

The first low refractive index flat layer LRF1 may have a first side surface SS1 inclined with respect to an upper surface of the first insulating layer IS_IL1 in the holes ML_OPR1, ML_OPG1, and ML_OPB1. The first side surface SS1 of the first low refractive index flat layer LRF1 may configure (e.g., form) a total reflection surface in relation to the first high refractive index flat layer HRF1. This will be described later with reference to FIG. 8.

In FIG. 7, the first low refractive index flat layer LRF1 has a cross-sectional shape of a trapezoid, but the first low refractive index flat layer LRF1 is not limited thereto. For example, the first low refractive index flat layer LRF1 may have a cross-sectional shape of a semicircle or semi-ellipse.

The first low refractive index flat layer LRF1 may include an organic material. For example, the first low refractive index flat layer LRF1 may be formed of a single film including an organic material such as an acryl resin, an epoxy resin, a phenolic resin, a polyamide resin, or a polyimide resin. However, the disclosure is not limited thereto. For example, the first low refractive index flat layer LRF1 may be formed of an acryl-based transparent organic film.

The first high refractive index flat layer HRF1 (or a second refractive layer) may be disposed directly on the first low refractive index flat layer LRF1 and the fourth insulating layer IS_IL1. The first high refractive index flat layer HRF1 may be disposed entirely on the fourth insulating layer IS_IL1.

The first high refractive index flat layer HRF1 may have a refractive index greater than that of the first low refractive index flat layer LRF1.

The first high refractive index flat layer HRF1 may include an organic material. For example, the first high refractive index flat layer HRF1 may be formed of a single layer including an organic material such as an acryl resin, an epoxy resin, a phenolic resin, a polyamide resin, or a polyimide resin, but it is not limited thereto as long as the organic material is an organic material having a refractive index greater than that of the first low refractive index flat layer LRF1.

Figure 8:
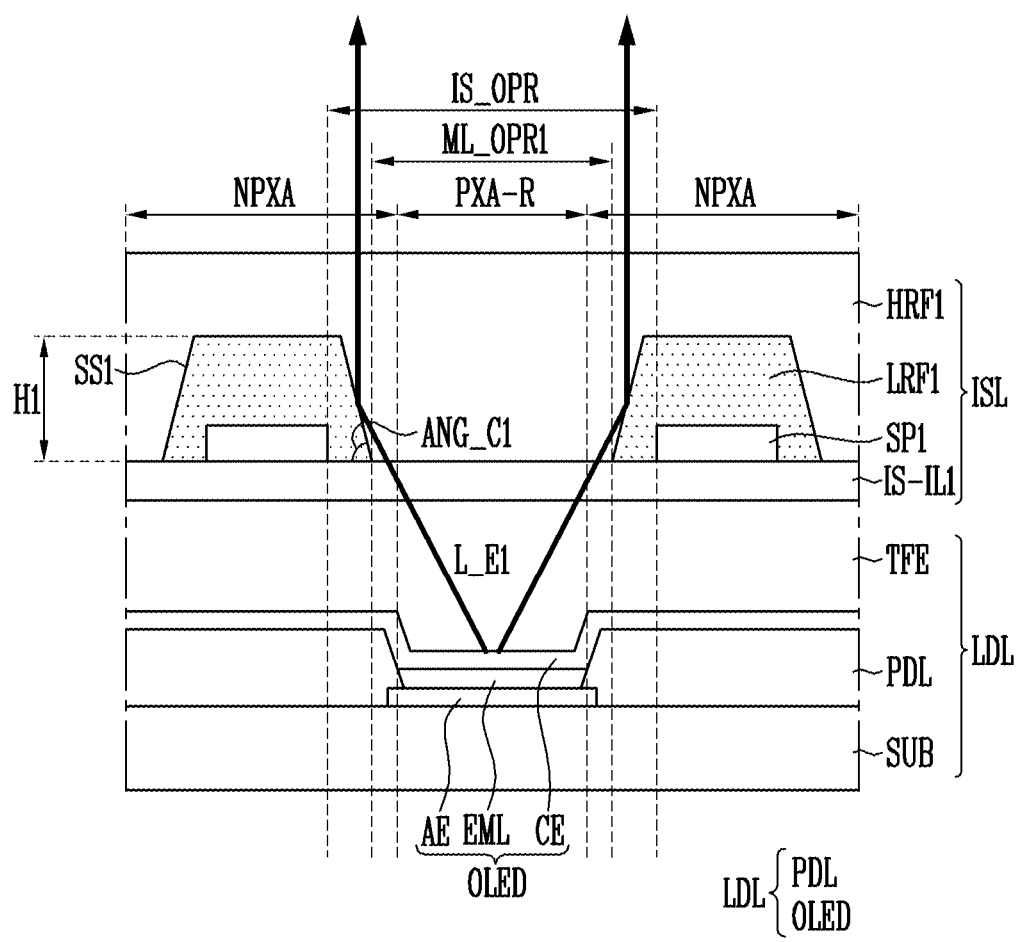
FIG. 8 is a cross-sectional view illustrating an example of a first pixel area included in the display device of FIG. 7.

FIG. 8 may be referred to for the description of the first low refractive index flat layer LRF1 and the first high refractive index flat layer HRF1.

FIG. 8 is a cross-sectional view illustrating an example of a first pixel area included in the display device of FIG. 7. FIG. 8 schematically shows the first pixel area corresponding to the first pixel PX1 centered on the light emitting element layer LDL and the input sensing layer ISL.

Referring to FIGS. 7 and 8, the first pixel PX1 may include a substrate SUB, and the substrate SUB may include the base layer BL and the pixel circuit layer PCL described with reference to FIG. 7.

First light L_E1 that is some of the light emitted from the light emitting element OLED passes through the thin film encapsulation layer TFE and the fourth insulating layer IS_IL1 and may be obliquely incident on the first high refractive index flat layer HRF1.

The first light L_E1 may be irradiated onto the first side surface SS1 of the first low refractive index flat layer LRF1 through the first high refractive index flat layer HRF1, all of the first light L_E1 is reflected (or totally reflected) at the first side surface SS1 of the first low refractive index flat layer LLF1 by a difference of the refractive indices (or a refractive index ratio) of the first low refractive index flat layer LRF1 and the first high refractive index flat layer HRF1, and the first light L_E1 reflected from the first low refractive index flat layer LLF1 may be front-surface-emitted. Therefore, light output efficiency of the first pixel PX1 (and the display device) may be improved.

In an embodiment, the difference between the refractive index of the first high refractive index flat layer HRF1 and the refractive index of the first low refractive index flat layer LRF1 may be about 0.2 to 0.4. That is, the refractive index of the first high refractive index flat layer HRF1 may be greater than the refractive index of the first low refractive index flat layer LRF1 by about 0.2 to 0.4. For example, the refractive index of the first high refractive index flat layer HRF1 may be about 1.5 or more, about 1.6 to 1.9, or about 1.8. The refractive index of the first low refractive index flat layer LRF1 may be about 1.3 to 1.6, or about 1.5.

In an embodiment, an inclination angle ANG_C1 (or a taper angle) of the first side surface SS1 of the first low refractive index flat layer LRF1 may be about 60 to 85 degrees, or about 70 to 75 degrees.

In an embodiment, a thickness H1 of the first low refractive index flat layer LRF1 may be about 1 μm to 3 μm, 1.5 μm to 2.5 μm, or about 1.8 μm to 2 μm.

The inclination angle ANG_C1 may be determined by the difference between the refractive index of the first high refractive index flat layer HRF1 and the refractive index of the first low refractive index flat layer LRF1. A critical angle of a total reflection may be determined by the difference between the refractive index of the first high refractive index flat layer HRF1 and the refractive index of the first low refractive index flat layer LRF1 and the inclination angle ANG_C1 of the first low refractive index flat layer LRF1 may be determined based on a divergence direction (or a divergence angle) of the first light L_E1 emitted from the light emitting element OLED and the critical angle. The inclination angle ANG_C1 may increase as the difference between the refractive index of the first high refractive index flat layer HRF1 and the refractive index of the first low refractive index flat layer LRF1 increases.

Similarly, a thickness H1 of the first low refractive index flat layer LRF1 may be determined by the inclination angle ANG_C1. The thickness H1 of the first low refractive index flat layer LRF1 may be reduced as the inclination angle ANG_C1 increases.

For example, when the difference between the refractive index of the first high refractive index flat layer HRF1 and the refractive index of the first low refractive index flat layer LRF1 is 0.3, the inclination angle ANG_C1 (or a maximum inclination angle) for totally reflecting the first light L_E1 may be 70 degrees, and the thickness of the first low refractive index flat layer LRF1 may be about 2 μm. As another example, when the difference between the refractive index of the first high refractive index flat layer HRF1 and the refractive index of the first low refractive index flat layer LRF1 is 0.35, the inclination angle ANG_C1 (or the maximum inclination angle) for totally reflecting the first light L_E1 generally may be about 75 degrees, and the thickness of the first low refractive index flat layer LRF1 may be about 1.8 μm.

As described with reference to FIGS. 7 and 8, the first low refractive index flat layer LRF1 may be formed on the second conductive layer IS_CL2 in the input sensing layer ISL, the holes ML_OPR1, ML_OPG1, and ML_OPB1 that expose the light emission areas PXA-R, PXA-G, and PXA-B are formed on the first low refractive index flat layer LRF1, and the first high refractive index flat layer HRF1 may be entirely disposed on the first low refractive index flat layer LRF1. Therefore, the first light L_E1 obliquely incident on the first high refractive index flat layer HRF1 is totally reflected by the first low refractive index flat layer LRF1, and the light output efficiency of the pixels may be improved.

In addition, as will be described later, the first low refractive index flat layer LRF1 is formed on the second conductive layer IS_CL2 in the input sensing layer ISL, and thus a manufacturing process of the display device may be simplified.

Figure 9:
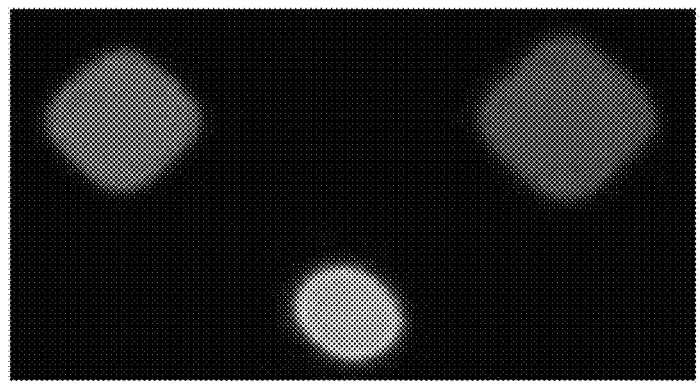
FIG. 9 is a diagram illustrating an example of an image displayed on the display device of FIG. 1.
Figure 9:
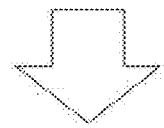
Figure 9:
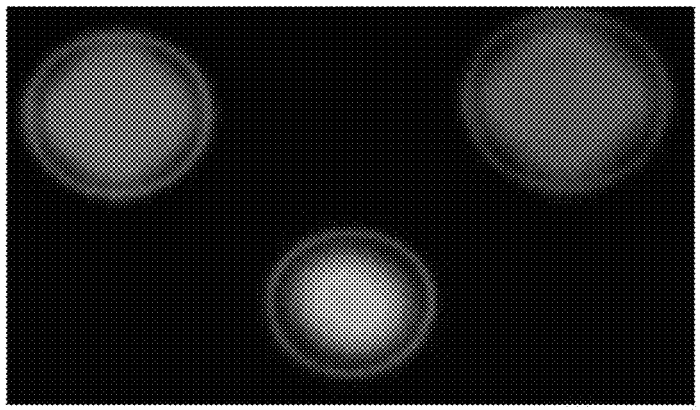

FIG. 9 is a diagram illustrating an example of an image displayed on the display device of FIG. 1.

Referring to FIGS. 1, 6, and 9, a first image IMAGE1 and a second image IMAGE2 may correspond to the second area A2 shown in FIG. 6.

The first image IMAGE1 and the second image IMAGE2 may correspond to the first to third pixels corresponding to the line I-I' of FIG. 5.

When the display device does not include the first low refractive index flat layer LRF1, as shown in the first image IMAGE1, dot images displayed by the pixels may have the same shape as shapes of the first to third light emission areas PXA-R, PXA-G, and PXA-B shown in FIG. 6.

When the display device includes the first low refractive index flat layer LRF1 and the first high refractive index flat layer HRF1 according to the embodiments of the disclosure, as shown in the second image IMAGE2, the dot images displayed by the pixels may have a shape corresponding to a shape of the holes ML_OPR1, ML_OPG1, and ML_OPB1 of the first low refractive index flat layer LRF1. That is, in addition to the light directly emitted from the first to third light emission areas PXA-R, PXA-G, and PXA-B, light that is totally reflected by the first side surface SS1 of the holes ML_OPR1, ML_OPG1, and ML_OPB1 of the first low refractive index flat layer LRF1 may be additionally emitted.

The light output efficiency of the pixels may be improved by about 10% to 20% by the first low refractive index flat layer LRF1.

FIGS. 10A to 10E are cross-sectional views of the input sensing layer illustrating a method of manufacturing the input sensing layer included in the display device of FIG. 8 in stages. For convenience of description, lower configurations of the thin film encapsulation layer TFE, which exclude the thin film encapsulation layer TFE of the light emitting element layer LDL are omitted in FIGS. 10A to 10E.

Figure 10A:
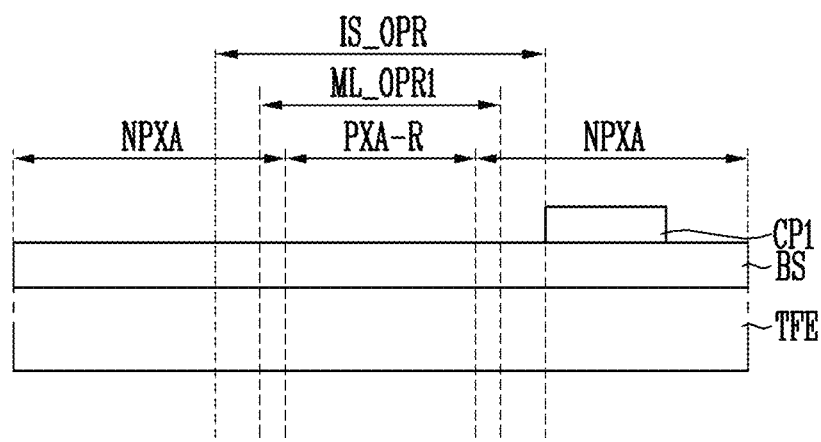
FIGS. 10A-10E are cross-sectional views of an input sensing layer illustrating a method of manufacturing the input sensing layer included in the display device of FIG. 8 in stages.

Referring to FIG. 10A, a base portion BS (or a second buffer layer) may be formed on the thin film encapsulation layer TFE. The base portion BS may function as a buffer layer and may be formed of silicon nitride (SiNx).

The first connection portions CP1 (or the first conductive layer IS_CL1 (e.g., refer to FIG. 8)) may be formed on the base portion BS. For example, a conductive layer may be formed on the base portion BS and the first connection portions CP1 may be formed by patterning the conductive layer.

Figure 10B:
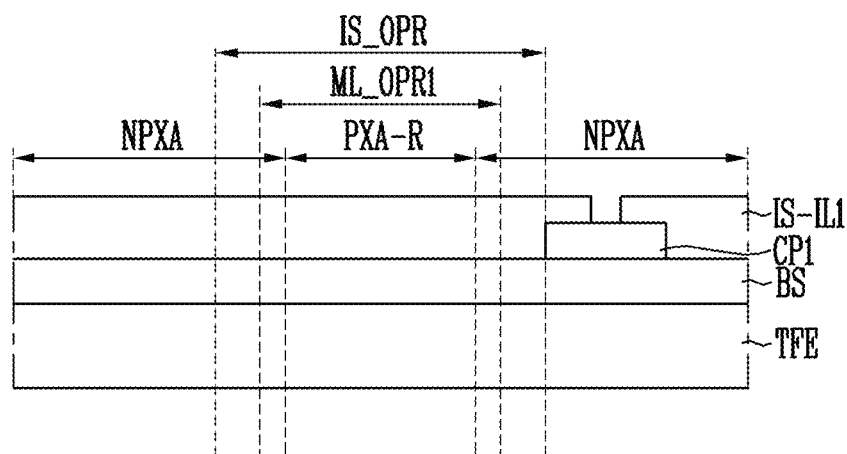

Referring to FIG. 10B, the fourth insulating layer IS_IL1 may be formed on the base portion BS to cover the first connection portions CP1, and the contact hole exposing the first connection portions CP1 may be formed through a photoresist process.

Figure 10C:
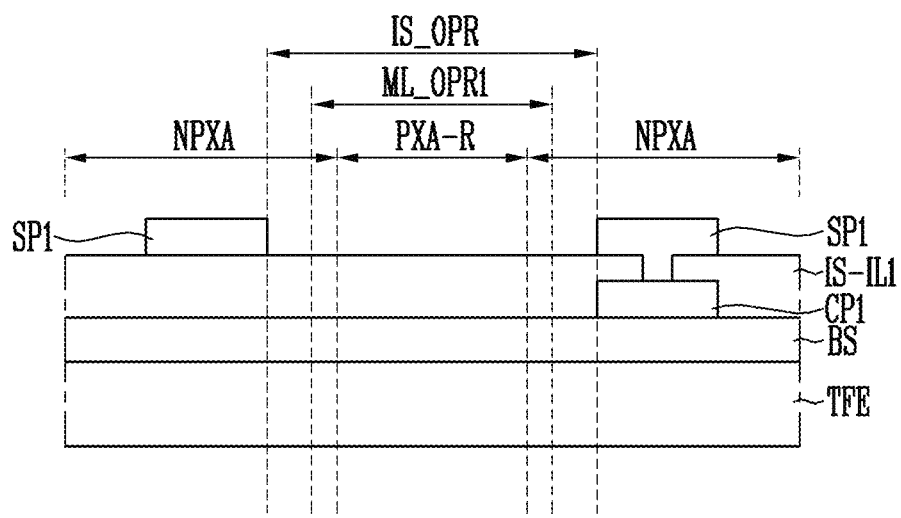

Thereafter, referring to FIG. 10C, the first sensor portions SP1 (or the second conductive layer IS_CL2 (e.g., refer to FIG. 8)) may be formed on the fourth insulating layer IS_IL1, and a portion of the first sensor portions SP1 may be in contact with the first connection portions CP1 through the contact holes of the fourth insulating layer IS_IL1. For example, a conductive layer may be formed on the fourth insulating layer IS_IL1, and the first sensor portions SP1 may be formed by patterning the conductive layer.

Figure 10D:
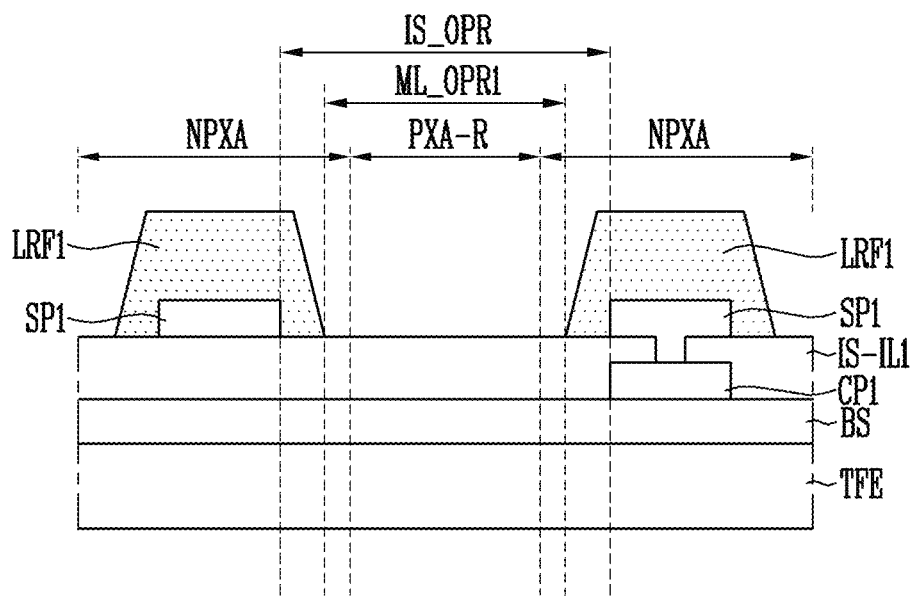

Referring to FIG. 10D, the first low refractive index flat layer LRF1 covering the first sensor portions SP1 may be formed. For example, an organic layer including the first low refractive index flat layer LRF1 may be formed on the entire surface of the first sensor portions SP1, a mask may be disposed on the organic layer, the organic layer may be partially exposed to light through the mask, and the first low refractive index flat layer LRF1 may be formed by partially removing the organic layer through a developer.

Figure 10E:
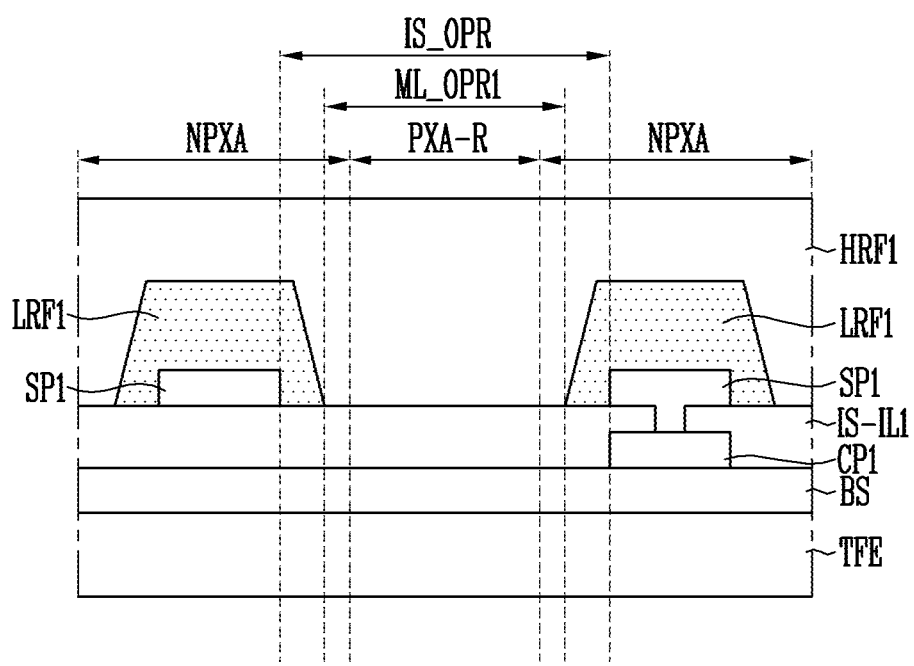

Thereafter, referring to FIG. 10E, the first high refractive index flat layer HRF1 may be formed on the fourth insulating layer IS_IL1 to cover the first low refractive index flat layer LRF1.

As described with reference to FIGS. 10A to 10E, the display device with improved light output efficiency may be manufactured by merely adding the process of forming the first low refractive index flat layer LRF1 covering the first sensor portions SP1 and the process of forming the first high refractive index flat layer HRF1. Particularly, the display device with improved light output efficiency may be manufactured only by substantially adding the process of forming the first low refractive index flat layer LRF1, that is, through a simplified manufacturing process or a minimized manufacturing process, in a fact that an insulating layer (or a flat layer) covering the first sensor portions SP1 is required in the input sensing layer ISL in order to protect the first sensor portions SP1 from the outside.

Figure 11:
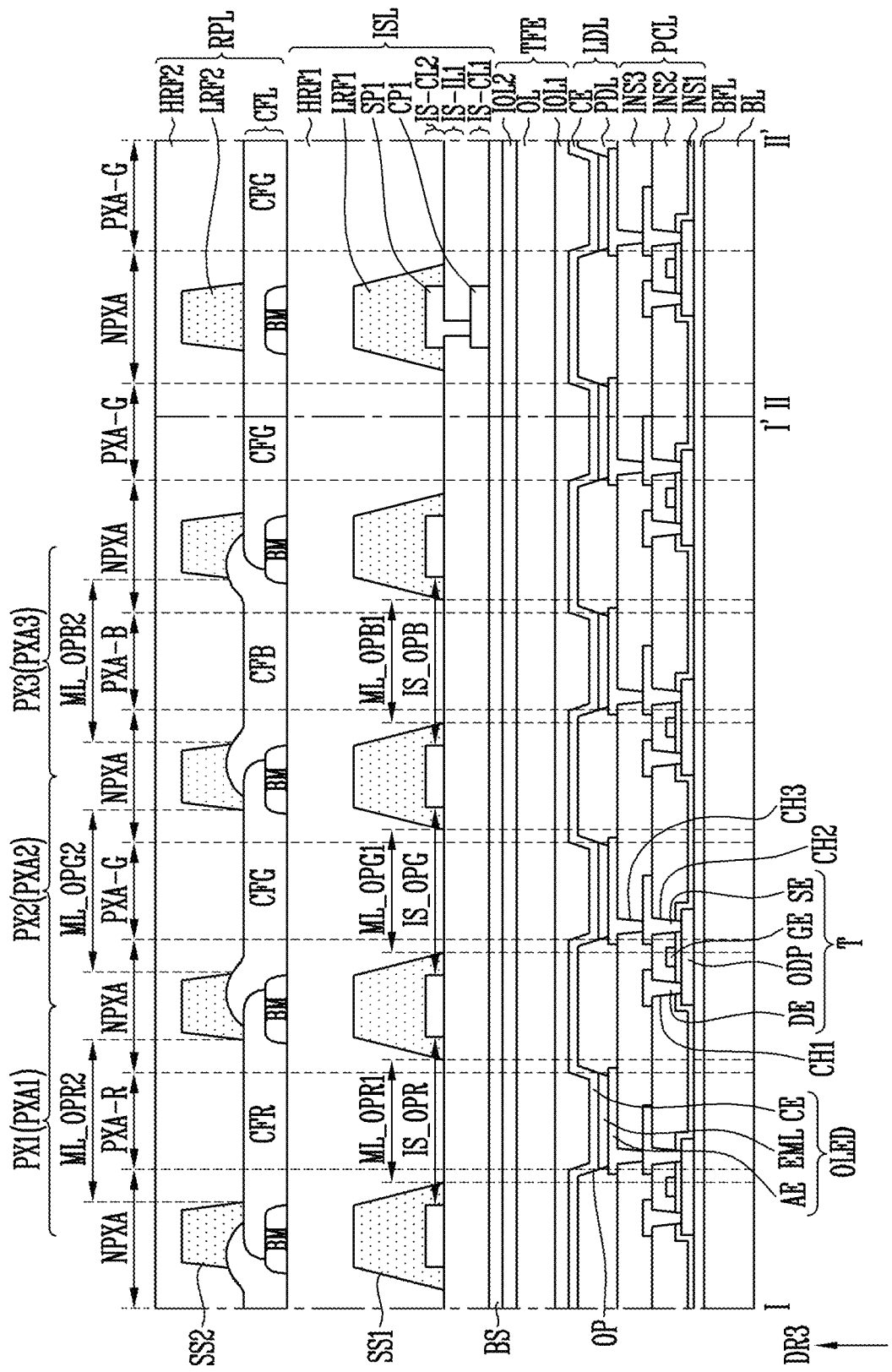
FIG. 11 is a cross-sectional view illustrating another example of the display device taken along the line I-I' and the line II-II' of FIG. 5.

FIG. 11 is a cross-sectional view illustrating another example of the display device taken along the line I-I' and the line II-II' of FIG. 5.

Referring to FIGS. 5, 7, and 11, the display device of FIG. 11 is different from the display device of FIG. 7 in that the display device of FIG. 11 further includes an anti-reflection layer RPL.

Since a base layer BL, a buffer layer BFL, a pixel circuit layer PCL, a light emitting element layer LDL, and an input sensing layer ISL included in the display device of FIG. 11 are substantially the same or similar to the base layer BL, the buffer layer BFL, the pixel circuit layer PCL, the light emitting element layer LDL, and the input sensing layer ISL described with reference to FIG. 7, respectively, the repetitive descriptions may be omitted.

The anti-reflection layer RPL may be formed on the input sensing layer ISL and may include a light transmission layer CFL (or a color conversion layer or a color filter layer), a second low refractive index flat layer LRF2 (or a third refractive layer), and a second high refractive index flat layer HRF2 (or a fourth refractive layer).

The light transmission layer CFL may include a black matrix BM and color filters CFR, CFG, and CFB.

The black matrix BM may have a mesh pattern or a mesh structure similarly to the first sensor portions SP1 described with reference to FIG. 5 or may have an opening corresponding to the opening portion OP of the pixel defining layer PDL described with reference to FIG. 7. The black matrix BM may not overlap the opening portion OP of the pixel defining layer PDL.

The opening of the black matrix BM may be greater than or equal to the opening portion OP of the pixel defining layer PDL. For example, on the plane, an area of the opening of the black matrix BM may be greater than an area of the opening portion OP of the pixel defining layer PDL, and on the plane, a width of the black matrix BM between the pixels may be less than a width of the pixel defining layer PDL.

The color filters CFR, CFG, and CFB may be disposed to cover the opening of the black matrix BM. That is, the color filters CFR, CFG, and CFB may be disposed on the first high refractive index flat layer HRF1 and the black matrix BM exposed by the opening of the black matrix BM. The color filters CFR, CFG, and CFB may completely cover the black matrix BM.

For example, when at least a portion of the black matrix BM is exposed by the color filters CFR, CFG, and CFB, or a second low refractive index flat layer LRF2 that is to be described later is directly disposed on the black matrix BM, light may be refracted or reflected between side walls of the color filters CFR, CFG, and CFB and the second low refractive index flat layer LRF2, and thus light output efficiency may not be improved or may be reduced. Therefore, the color filters CFR, CFG, and CFB may completely cover the black matrix BM.

The second low refractive index flat layer LRF2 may be disposed on the light transmission layer CFL and may overlap the black matrix BM.

Similarly to the first low refractive index flat layer LRF1 described with reference to FIG. 4, the second low refractive index flat layer LRF2 may include auxiliary holes ML_OPR2, ML_OPG2, and ML_OPB2, and the auxiliary holes ML_OPR2, ML_OPG2, and ML_OPB2 may correspond to the light emission areas PXA-R, PXA-G, and PXA-B (or the mesh holes IS_OPR, IS_OPG, and IS_OPB) one-to-one.

In an embodiment, the auxiliary holes ML_OPR2, ML_OPG2, and ML_OPB2 may be greater in size than the light emission areas PXA-R, PXA-G, and PXA-B, respectively, and may be greater in size than holes ML_OPR1, ML_OPG1, ML_OPB1 of the first low refractive index flat layer LRF1.

For example, a size (a width, or an area on a plane) of the first auxiliary hole ML_OPR2 may be greater than a size of the first emission area PXA-R of the first pixel PX1 and may be greater than a size of the first hole ML_OPR1. Similarly, a size of the second auxiliary hole ML_OPG2 may be greater than a size of the second light emission area PXA-G of the second pixel PX2 and may be greater than a size of the second hole ML_OPG1. A size of the third auxiliary hole ML_OPB2 may be greater than a size of the third light emission area PXA-B of the third pixel PX3 and may be greater than a size of the third hole ML_OPB1.

The second low refractive index flat layer LRF2 may have a second side surface SS2 inclined with respect to the light transmission layer CFL in the auxiliary holes ML_OPR2, ML_OPG2, and ML_OPB2. The second side surface SS2 of the second low refractive index flat layer LRF2 may configure (e.g., form) a total reflection surface in relation to the second high refractive index flat layer HRF2.

The second low refractive index flat layer LRF2 may include an organic material similarly to the first low refractive index flat layer LRF1.

The second high refractive index flat layer HRF2 may be disposed directly on the second low refractive index flat layer LRF2 and the light transmission layer CFL. The second high refractive index flat layer HRF2 may be disposed on the entire surface of the light transmission layer CFL.

The second high refractive index flat layer HRF2 may have a refractive index greater than that of the second low refractive index flat layer LRF2.

The second high refractive index flat layer HRF2 may include an organic material similarly to the first high refractive index flat layer HRF1.

Figure 12:
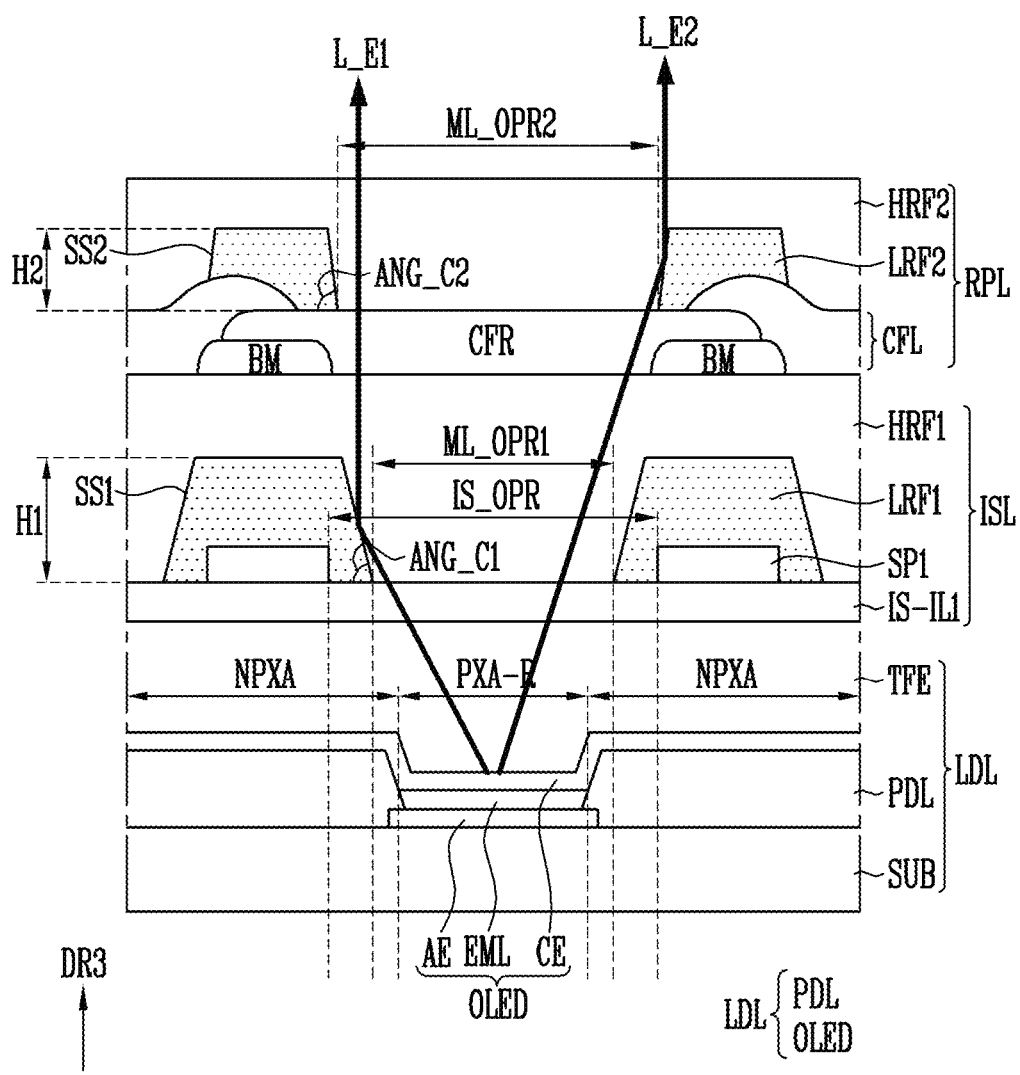
FIG. 12 is a cross-sectional view illustrating an example of a first pixel area included in the display device of FIG. 11.

FIG. 12 may be referred to for the description of the second low refractive index flat layer LRF2 and the second high refractive index flat layer HRF2.

FIG. 12 is a cross-sectional view illustrating an example of a first pixel area included in the display device of FIG. 11. FIG. 12 schematically shows the first pixel area corresponding to the first pixel PX1 centered on the light emitting element layer LDL, the input sensing layer ISL, and the anti-reflection layer RPL.

Referring to FIGS. 8, 11, and 12, except for the anti-reflection layer PRL, the display device shown in FIG. 12 is substantially the same as or similar to the display device of FIG. 8, and thus the repetitive descriptions may be omitted.

In an embodiment, a difference between a refractive index of the second high refractive index flat layer HRF2 and a refractive index of the second low refractive index flat layer LRF2 may be less than or equal to the difference between the refractive index of the first high refractive index flat layer HRF1 and the refractive index of the first low refractive index flat layer LRF1. For example, the difference between the refractive index of the second high refractive index flat layer HRF2 and the refractive index of the second low refractive index flat layer LRF2 may be about 0.2 to 0.3, and the refractive index of the second high refractive index flat layer HRF2 may be greater than the refractive index of the second low refractive index flat layer LRF2 by 0.2 to 0.3.

In an embodiment, a second inclination angle ANG_C2 of the second side surface SS2 of the second low refractive index flat layer LRF2 may be less than or equal to the inclination angle ANG_C1 of the first side surface SS1 of the first low refractive index flat layer LRF1. For example, the second inclination angle ANG_C2 of the second side surface SS2 of the second low refractive index flat layer LRF2 may be about 70 to 85 degrees, or about 75 to 80 degrees.

The first light L_E1 incident on the first low refractive index flat layer LRF1 of the input sensing layer ISL may be generally reflected in the third direction DR3 by the first low refractive index flat layer LRF1 of the input sensing layer ISL. The first light L_E1 that is not incident on the first low refractive index flat layer LRF1 of the input sensing layer ISL may be reflected by the second low refractive index flat layer LRF2. Since the first light L_E1 has an inclination angle relatively greater than that of the first light L_E1, the second inclination angle ANG_C2 of the second side surface SS2 of the second low refractive index flat layer LRF2 may be relatively large. In addition, since a critical angle for a total reflection of the second low refractive index flat layer LRF2 is relatively small, the difference between the refractive index of the second high refractive index flat layer HRF2 and the refractive index of the second low refractive index flat layer LRF2 may be relatively small.

In an embodiment, a thickness H2 of the second low refractive index flat layer LRF2 may be less than or equal to the thickness H1 of the first low refractive index flat layer LRF1 and a sum of the thickness H2 of the second low refractive index flat layer LRF2 and the thickness H1 of the first low refractive index flat layer LLF1 may be about 1 μm to 3 μm, 1.5 μm to 2.5 μm, or about 1.8 μm to 2 μm.

The display device of FIG. 8 may have a relatively great thickness in order to generally reflect light that is obliquely emitted from the upper surface of the light emitting element OLED (e.g., in order to reflect second light L_E2 shown in FIG. 12) by using one first low refractive index flat layer LRF1. Alternatively, the display device of FIG. 12 includes the second low refractive index flat layer LRF2 of the anti-reflection layer RPL in addition to the first low refractive index flat layer LRF1, and thus the thickness H1 of the first low refractive index flat layer LRF1 may be relatively small.

As described with reference to FIG. 12, in addition to the light path control structure (i.e., the first low refractive index flat layer LRF1 and the first high refractive index flat layer HRF1) formed in the input sensing layer ISL, the display device may further include a light path control structure (i.e., the second low refractive index flat layer LRF2 and the second high refractive index flat layer HRF2) formed in the anti-reflection layer RPL. Therefore, the light output efficiency of the display device (or the pixels) may be improved.

Figure 13:
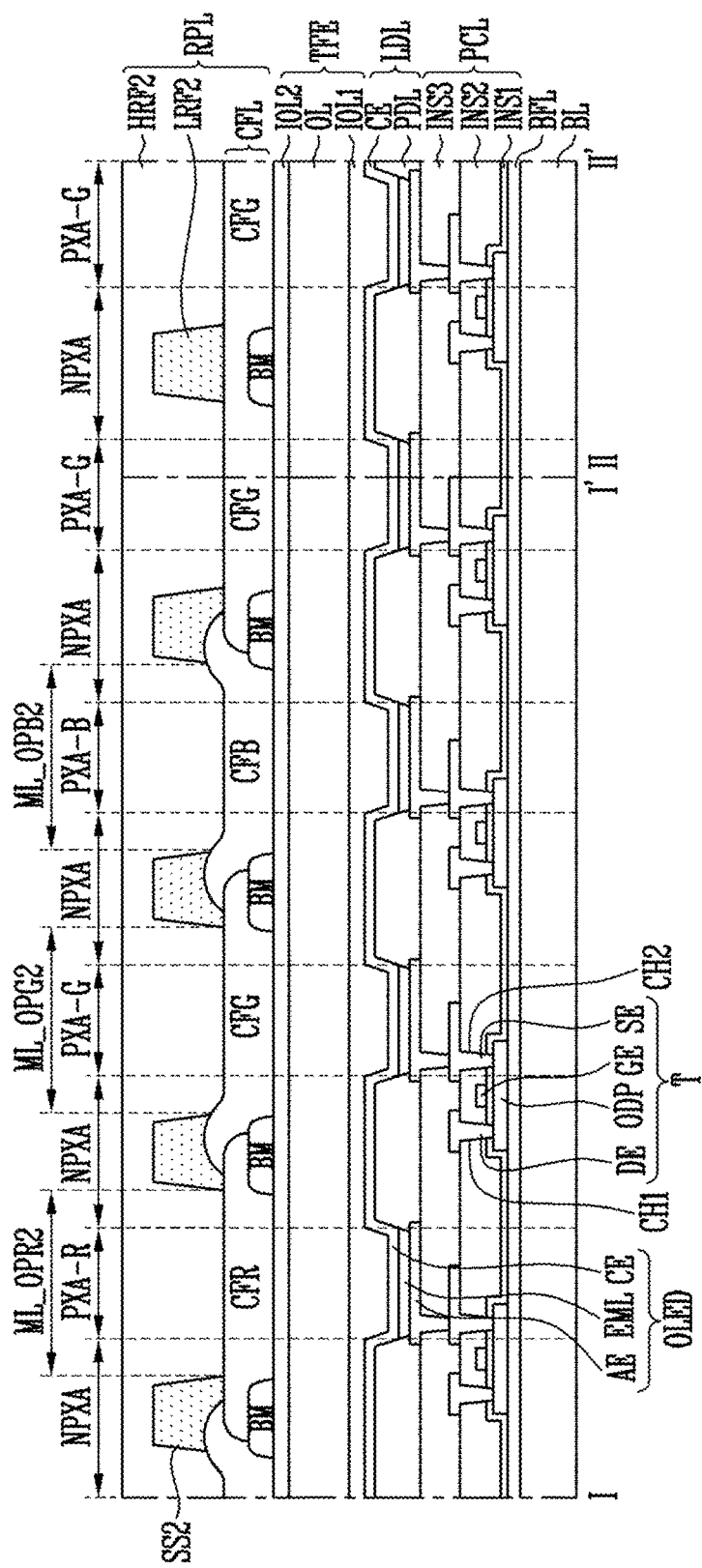
FIG. 13 is a cross-sectional view illustrating still another example of the display device of FIG. 1.
Figure 14:
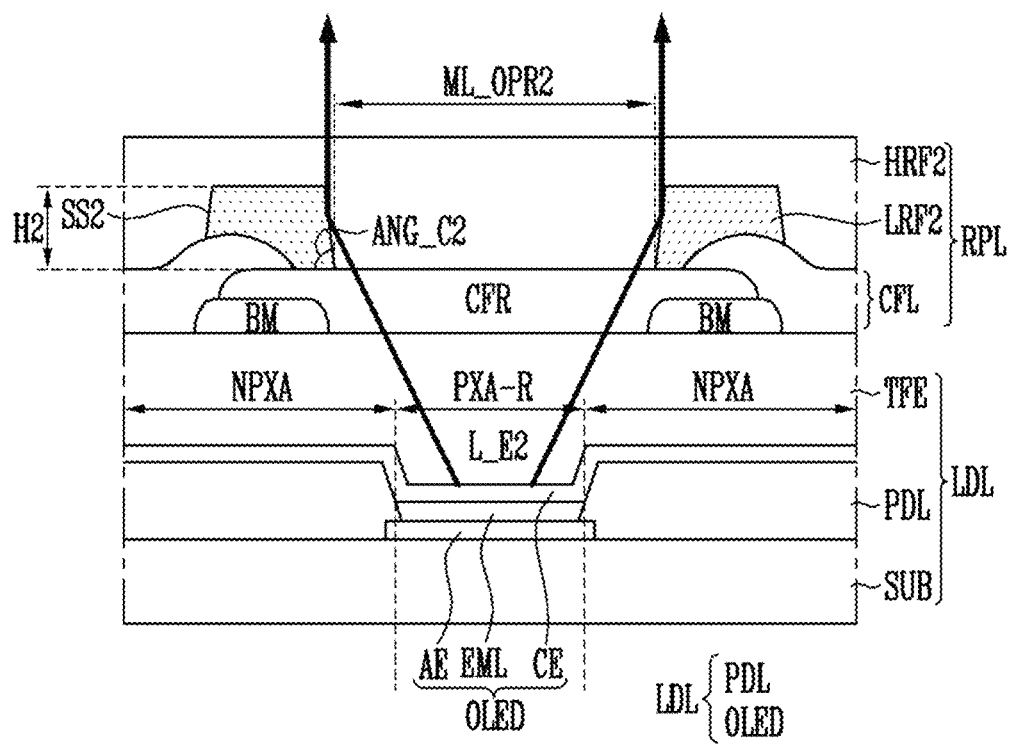
FIG. 14 is a cross-sectional view illustrating an example of a first pixel area included in the display device of FIG. 13.

FIG. 13 is a cross-sectional view illustrating still another example of the display device of FIG. 1. FIG. 13 shows a display device corresponding to the display device of FIG. 11. FIG. 14 is a cross-sectional view illustrating an example of a first pixel area included in the display device of FIG. 13.

Referring to FIGS. 11 to 14, the display device of FIG. 13 is different from the display device of FIG. 11 in that the display device of FIG. 13 does not include an input sensing layer ISL.

Since a base layer BL, a buffer layer BFL, a pixel circuit layer PCL, a light emitting element layer LDL, and an anti-reflection layer RPL included in the display device of FIG. 13 are substantially the same or similar to the base layer BL, the buffer layer BFL, the pixel circuit layer PCL, the light emitting element layer LDL, and the anti-reflection layer RPL shown in FIG. 11, respectively, the repetitive descriptions may be omitted.

The anti-reflection layer RPL may be formed on the light emitting element layer LDL and may include a light transmission layer CFL, a second low refractive index flat layer LRF2 and a second high refractive index flat layer HRF2.

The light transmission layer CFL may include a black matrix BM and color filters CFR, CFG, and CFB.

The second low refractive index flat layer LRF2 may be disposed on the light transmission layer CFL and may overlap the black matrix BM.

Similarly to the first low refractive index flat layer LRF1 described with reference to FIG. 4, the second low refractive index flat layer LRF2 may include auxiliary holes ML_OPR2, ML_OPG2, and ML_OPB2, and the auxiliary holes ML_OPR2, ML_OPG2, and ML_OPB2 may correspond to the light emission areas PXA-R, PXA-G, and PXA-B (or the mesh holes IS_OPR, IS_OPG, and IS_OPB) one-to-one.

In an embodiment, the auxiliary holes ML_OPR2, ML_OPG2, and ML_OPB2 may be greater in size than the light emission areas PXA-R, PXA-G, and PXA-B, respectively, and may be greater in size than a width of a black matrix BM in the non-light emission area NPXA.

For example, a size (a width, or an area on a plane) of the first auxiliary hole ML_OPR2 may be greater than a size of the first emission area PXA-R of the first pixel PX1 and may be greater than the width of a black matrix BM.

The second low refractive index flat layer LRF2 may have a second side surface SS2 inclined with respect to the light transmission layer CFL in the auxiliary holes ML_OPR2, ML_OPG2, and ML_OPB2. The second side surface SS2 of the second low refractive index flat layer LRF2 may configure (e.g., form) a total reflection surface in relation to the second high refractive index flat layer HRF2.

As shown in FIG. 14, second light L_E2 that is some of the light emitted from the light emitting element OLED may be irradiated onto the second side surface SS2 of the second low refractive index flat layer LRF2 through the second high refractive index flat layer HRF2, and may be totally reflected at the second side surface SS2 of the second low refractive index flat layer LLF2 by a difference of the refractive indices (or a refractive index ratio) of the second low refractive index flat layer LRF2 and the second high refractive index flat layer HRF2.

In an embodiment, the refractive index of the second high refractive index flat layer HRF2 may be greater than the refractive index of the second low refractive index flat layer LRF2 by about 0.2 to 0.4. For example, the refractive index of the second high refractive index flat layer HRF2 may be about 1.5 or more, about 1.6 to 1.9, or about 1.8. The refractive index of the second low refractive index flat layer LRF2 may be about 1.3 to 1.6, or about 1.5.

In an embodiment, a second inclination angle ANG_C2 (or a taper angle) of the second side surface SS2 of the second low refractive index flat layer LRF2 may be about 60 to 85 degrees, or about 70 to 75 degrees.

In an embodiment, a thickness H2 of the second low refractive index flat layer LRF2 may be about 1 μm to 3 μm, 1.5 μm to 2.5 μm, or about 1.8 μm to 2 μm.

Since a relationship between the refractive index difference, the second inclination angle ANG_C2, and the thickness H2 is substantially the same as the relationship between the refractive index difference, the first inclination angle ANG_C1, and the thickness H1 described with reference to FIG. 8, and thus the repetitive descriptions may be omitted.

As described with reference to FIGS. 13 and 14, when the display device does not include the input sensing layer ISL (e.g., refer to FIG. 11), a light path control structure (i.e., the second low refractive index flat layer LRF2 and the second high refractive index flat layer HRF2) may be formed in the anti-reflection layer RPL. Therefore, the light output efficiency of the pixels may be improved.

In addition, similarly to the manufacturing process described with reference to FIGS. 10A to 10E, the display device with improved light output efficiency may be manufactured only by substantially adding a process of forming the second low refractive index flat layer LRF2, that is, through a simplified manufacturing process or a minimized manufacturing process.

Figure 15:
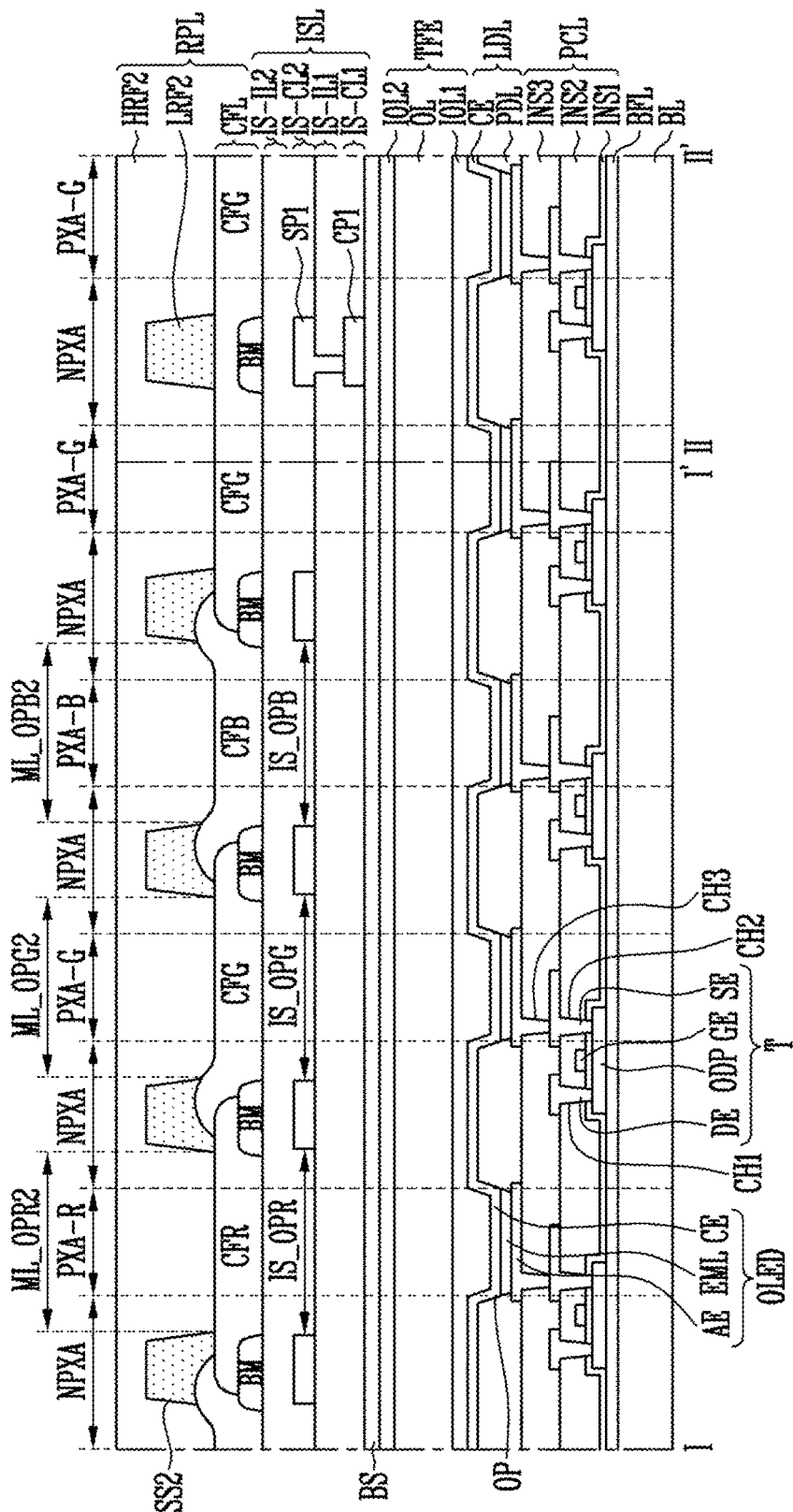
FIG. 15 is a cross-sectional view illustrating still another example of the display device taken along the line I-I' and the line II-II' of FIG. 5.

FIG. 15 is a cross-sectional view illustrating still another example of the display device taken along the line I-I' and the line II-II' of FIG. 5.

Referring to FIGS. 11 and 15, the display device of FIG. 15 is different from the display device of FIG. 11 in that an input sensing layer ISL does not include a first low refractive index flat layer LRF1 and a first high refractive index flat layer HRF1.

Since a base layer BL, a buffer layer BFL, a pixel circuit layer PCL and a light emitting element layer LDL included in the display device of FIG. 15 are substantially the same or similar to the base layer BL, the buffer layer BFL, the pixel circuit layer PCL, and the light emitting element layer LDL shown in FIG. 11, respectively, the repetitive descriptions may be omitted.

The input sensing layer ISL may be provided on the thin-film encapsulation layer TFE. The input sensing layer ISL may include a second buffer layer BFL2, a first conductive layer IS_CL1, a fourth insulating layer IS_IL1, a second conductive layer IS_CL2, and a fifth insulating layer IS_IL2.

Since the second buffer layer BFL2, the first conductive layer IS_CL1, the fourth insulating layer IS_IL1, and the second conductive layer IS_CL2 are substantially the same or similar to the second buffer layer BFL2, the first conductive layer IS_CL1, the fourth insulating layer IS_IL1, and the second conductive layer IS_CL2 shown in FIG. 11, the repetitive descriptions may be omitted.

The fifth insulating layer IS_IL2 may be disposed on the second conductive layer IS_CL2 and the fourth insulating layer IS_IL1. The fifth insulating layer IS_IL2 may have a single layer or multi-layer structure. The fifth insulating layer IS_IL2 may include an inorganic material, an organic material, or a composite material.

In an embodiment, the fifth insulating layer IS_IL2 may include an inorganic film. The inorganic film may include at least one of aluminum oxide, titanium oxide, silicon oxide, silicon oxynitride, zirconium oxide, and hafnium oxide. For example, the fifth insulating layer IS_IL2 may include silicon oxide.

As described with reference to FIG. 15, the display device may include only a light path control structure (i.e., the second low refractive index flat layer LRF2 and the second high refractive index flat layer HRF2) formed in the anti-reflection layer RPL.

It will be understood that, although the terms "first", "second", "third", etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section discussed below could be termed a second element, component, region, layer or section, without departing from the spirit and scope of the inventive concept.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. In addition, it will also be understood that when a layer is referred to as being "between" two layers, it can be the only layer between the two layers, or one or more intervening layers may also be present.

The terminology used herein is for the purpose of describing particular embodiments and is not intended to be limiting of the inventive concept. As used herein, the singular forms "a" and "an" are intended to include the plural forms as well, unless the context clearly indicates otherwise. It will be further understood that the terms "include," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ.

Further, the use of "may" when describing embodiments of the inventive concept refers to "one or more embodiments of the inventive concept." Also, the term "exemplary" is intended to refer to an example or illustration.

It will be understood that when an element or layer is referred to as being "on", "connected to", "coupled to", or "adjacent" another element or layer, it can be directly on, connected to, coupled to, or adjacent the other element or layer, or one or more intervening elements or layers may be present. When an element or layer is referred to as being "directly on," "directly connected to", "directly coupled to", or "immediately adjacent" another element or layer, there are no intervening elements or layers present.

As used herein, the term "substantially," "about," and similar terms are used as terms of approximation and not as terms of degree, and are intended to account for the inherent variations in measured or calculated values that would be recognized by those of ordinary skill in the art.

As used herein, the terms "use," "using," and "used" may be considered synonymous with the terms "utilize," "utilizing," and "utilized," respectively.

Also, any numerical range recited herein is intended to include all subranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein. All such ranges are intended to be inherently described in this specification.

The display device and/or any other relevant devices or components according to embodiments of the present invention described herein may be implemented utilizing any suitable hardware, firmware (e.g. an application-specific integrated circuit), software, or a suitable combination of software, firmware, and hardware. For example, the various components of the display device may be formed on one integrated circuit (IC) chip or on separate IC chips. Further, the various components of the display device may be implemented on a flexible printed circuit film, a tape carrier package (TCP), a printed circuit board (PCB), or formed on a same substrate. Further, the various components of the display device may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the scope of the exemplary embodiments of the present invention.

The scope of the disclosure is not limited to the details described in the detailed description of the specification, but should be determined by the claims and their equivalents. In addition, it is to be understood that all changes or modifications derived from the meaning and scope of the claims and equivalent concepts thereof are included in the scope of the disclosure.

What is claimed is:

1. A display device comprising:
    a pixel defining layer on a substrate and defining a light emission area;
    a light emitting element layer in the light emission area;
    a sensing electrode on the pixel defining layer;
    a first organic layer covering the sensing electrode and having sidewalls defining an opening therebetween corresponding to the light emission area;
    an anti-reflection layer on the first organic layer; and
    a second organic layer between the first organic layer and the anti-reflection layer and filled in the opening of the first organic layer, the second organic layer contacting the sidewalls of the first organic layer.

2. The display device according to claim 1, wherein the anti-reflection layer comprises a color filter.

3. The display device according to claim 1, wherein the sensing electrode has a mesh hole corresponding to the light emission area, and
    wherein the mesh hole of the sensing electrode is greater in size than the opening of the first organic layer in a plan view.

4. The display device according to claim 3, wherein the opening of the first organic layer is greater in size than the light emission area.

5. The display device according to claim 3, wherein the opening of the first organic layer has a planar shape identical to a planar shape of the mesh hole of the sensing electrode.

6. The display device according to claim 3, wherein the opening of the first organic layer has a planar shape different from a planar shape of the mesh hole of the sensing electrode.

7. The display device according to claim 6, wherein the mesh hole has the planar shape of a rhombus, and wherein the opening has the planar shape of a circle.

8. The display device according to claim 1, wherein a size of the opening is based on a color of light to be emitted from the light emitting element layer.

9. The display device according to claim 1, further comprising:

an insulating layer between the pixel defining layer and the first organic layer, wherein the sensing electrode is interposed between the insulating layer and the first organic layer.

10. The display device according to claim 9, further comprising:

a conductive layer between the insulating layer and the pixel defining layer and electrically connected to the sensing electrode.

11. The display device according to claim 10, wherein the insulating layer is located entirely on the substrate.

12. The display device according to claim 1, wherein an inclination angle of a side surface of the first organic layer in the opening is within a range of about 60 degrees to about 85 degrees with respect to an upper surface of the substrate.

13. The display device according to claim 1, wherein the first organic layer directly covers the sensing electrode.

14. The display device according to claim 13, wherein the second organic layer is directly on the first organic layer.

15. The display device according to claim 13, wherein a first optical refractive index of the first organic layer is less than a second optical refractive index of the second organic layer.

16. The display device according to claim 15, wherein the second optical refractive index of the second organic layer is greater than the first optical refractive index of the first organic layer by 0.2 to 0.4.

17. The display device according to claim 13, wherein each of the first organic layer and the second organic layer comprises at least one of an acryl resin, an epoxy resin, a phenolic resin, a polyamide resin, and a polyimide resin.

18. The display device according to claim 1, wherein the anti-reflection layer comprises a phase retarder and a polarizer.

19. The display device according to claim 1, wherein the first organic layer has a thickness of about 1 μm to about 3 μm.

* * * * *